United States Patent
Li

(10) Patent No.: US 9,228,732 B2
(45) Date of Patent: Jan. 5, 2016

(54) MODULAR LED LIGHTING SYSTEMS, INCLUDING FLEXIBLE, RIGID, AND WATERPROOF LIGHTING STRIPS AND CONNECTORS

(71) Applicant: Qing (Charles) Li, Las Vegas, NV (US)

(72) Inventor: Qing (Charles) Li, Las Vegas, NV (US)

(73) Assignee: US VAOPTO, INC., Las Vegas, NV (US)

( * ) Notice: Subject to any disclaimer, the term of this patent is extended or adjusted under 35 U.S.C. 154(b) by 0 days.

(21) Appl. No.: 13/969,176

(22) Filed: Aug. 16, 2013

(65) Prior Publication Data

US 2014/0085896 A1 Mar. 27, 2014

Related U.S. Application Data

(63) Continuation-in-part of application No. 12/975,112, filed on Dec. 21, 2010, now Pat. No. 8,641,229, and a continuation-in-part of application No. 12/499,306, filed on Jul. 8, 2009, now Pat. No. 8,262,250, (Continued)

(51) Int. Cl.
*F21V 23/06* (2006.01)
*F21V 31/00* (2006.01)
(Continued)

(52) U.S. Cl.
CPC .................. *F21V 23/06* (2013.01); *F21S 4/008* (2013.01); *F21V 17/007* (2013.01); *F21V 21/32* (2013.01);
(Continued)

(58) Field of Classification Search
CPC ............ F21V 23/06; F21S 4/003; F21S 4/004
See application file for complete search history.

(56) References Cited

U.S. PATENT DOCUMENTS 2,414,866 A 1/1947 Henry
4,173,035 A 10/1979 Hoyt
(Continued)

FOREIGN PATENT DOCUMENTS

CN 201000001 Y 1/2008
CN 201021793 Y 2/2008
(Continued)

OTHER PUBLICATIONS

Co-pending U.S. Appl. No. 12/499,306, filed Jul. 8, 2009, published as US Publication No. 2010/0008090 on Jan. 14, 2010, and patented as U.S. Pat. No. 8,262,250 on Sep. 11, 2012.
(Continued)

*Primary Examiner* — Thomas M Sember
(74) *Attorney, Agent, or Firm* — New River Valley IP Law, PC; Michele L. Mayberry

(57) ABSTRACT

Modular lighting systems are provided that comprise lighting strips physically and electrically connectable with one another by way of flexible connectors. The lighting strip devices can be made of flexible or rigid material to allow for applying the lighting devices along flat as well as contoured surfaces and can be waterproof or water resistant. A modular lighting strip system is provided comprising: two or more lighting strips comprising a non-conductive substrate strip with an electrical circuit; a plurality of light sources operably connected to the electrical circuit; a plug or socket at opposing ends of the strip; one or more connectors for providing electrical and physical interconnection of the lighting strips comprising: one or more plug and/or socket and one or more flexible wires interconnecting the plugs or sockets, which are operably configured to provide for side-by-side interconnection of lighting strips.

20 Claims, 26 Drawing Sheets

Related U.S. Application Data application No. 13/969,176, which is a continuation-in-part of application No. 13/106,558, filed on May 12, 2011, now abandoned, and a continuation-in-part of application No. 12/975,112, filed on Dec. 21, 2010, now Pat. No. 8,641,229.

(60) Provisional application No. 61/288,815, filed on Dec. 21, 2009, provisional application No. 61/079,042, filed on Jul. 8, 2008, provisional application No. 61/333,806, filed on May 12, 2010.

(51) Int. Cl.
| | | |
|---|---|---|
| *F21V 21/32* | (2006.01) | |
| *F21S 4/00* | (2006.01) | |
| *F21V 17/00* | (2006.01) | |
| *F21V 21/005* | (2006.01) | |
| *H05K 1/18* | (2006.01) | |
| *H05K 3/28* | (2006.01) | |
| *F21Y 101/02* | (2006.01) | |
| *F21Y 103/00* | (2006.01) | |
| *F21Y 113/00* | (2006.01) | |

(52) U.S. Cl.
CPC ............... *F21V 31/00* (2013.01); *F21V 21/005* (2013.01); *F21Y 2101/02* (2013.01); *F21Y 2103/003* (2013.01); *F21Y 2113/005* (2013.01); *F21Y 2113/007* (2013.01); *H05K 1/189* (2013.01); *H05K 3/284* (2013.01); *H05K 2201/10106* (2013.01); *H05K 2201/10189* (2013.01)

(56) References Cited

U.S. PATENT DOCUMENTS

| | | | |
|---|---|---|---|
| 4,373,035 A | 2/1983 | Bowen | |
| 4,479,686 A | 10/1984 | Hoshino et al. | |
| 5,107,408 A | 4/1992 | Vernondier | |
| 5,342,221 A | 8/1994 | Peterson | |
| 5,559,681 A | 9/1996 | Duarte | |
| 5,644,839 A | 7/1997 | Stone | |
| 5,788,520 A | 8/1998 | Roche | |
| 5,848,837 A | 12/1998 | Gustafson | |
| 5,944,547 A | 8/1999 | Golab et al. | |
| 6,050,850 A | 4/2000 | Crane, Jr. et al. | |
| 6,183,104 B1 * | 2/2001 | Ferrara | 362/145 |
| 6,210,189 B1 | 4/2001 | Gantt | |
| 6,257,925 B1 | 7/2001 | Jones | |
| 6,273,587 B1 | 8/2001 | Demshki | |
| 6,341,875 B1 | 1/2002 | Chu | |
| 6,394,623 B1 | 5/2002 | Tsui | |
| 6,579,107 B1 | 6/2003 | Sanroma | |
| 6,673,293 B1 | 1/2004 | Mistopoulos et al. | |
| 6,796,680 B1 | 9/2004 | Showers et al. | |
| 6,814,583 B1 | 11/2004 | Young et al. | |
| 6,893,144 B2 | 5/2005 | Fan | |
| 7,083,455 B1 | 8/2006 | Miura et al. | |
| 7,101,188 B1 | 9/2006 | Summers et al. | |
| 7,114,247 B2 | 10/2006 | Swantner et al. | |
| 7,137,849 B2 | 11/2006 | Nagata | |
| 7,210,818 B2 | 5/2007 | Luk et al. | |
| 7,264,374 B1 | 9/2007 | Spika | |
| 7,374,457 B1 | 5/2008 | Oksengendler et al. | |
| 7,703,941 B2 | 4/2010 | Lee | |
| 7,771,204 B2 | 8/2010 | Stoyan | |
| 8,200,861 B2 | 6/2012 | Davis et al. | |
| 8,262,250 B2 | 9/2012 | Li et al. | |
| 2004/0252500 A1 | 12/2004 | Lin | |
| 2008/0094828 A1 | 4/2008 | Shao | |
| 2009/0091945 A1 | 4/2009 | Joseph | |
| 2010/0008090 A1 | 1/2010 | Li et al. | |
| 2010/0118532 A1 | 5/2010 | Liang et al. | |
| 2011/0255287 A1 | 10/2011 | Li | |
| 2012/0002417 A1 | 1/2012 | Li | |

FOREIGN PATENT DOCUMENTS

| | | |
|---|---|---|
| CN | 201053600 Y | 4/2008 |
| CN | 201145159 Y | 11/2008 |

OTHER PUBLICATIONS

Co-pending U.S. Appl. No. 12/975,112, filed Dec. 21, 2010, published as US Publication No. 2012/0002417 on Jan. 5, 2012.
Co-pending U.S. Appl. No. 13/106,558, filed May 12, 2011, and published as US Publication No. 2011/0255287 on Oct. 20, 2011.
Flex Connectors User's Guide, Osram Sylvania, Oct. 2007, 6 pages.

* cited by examiner

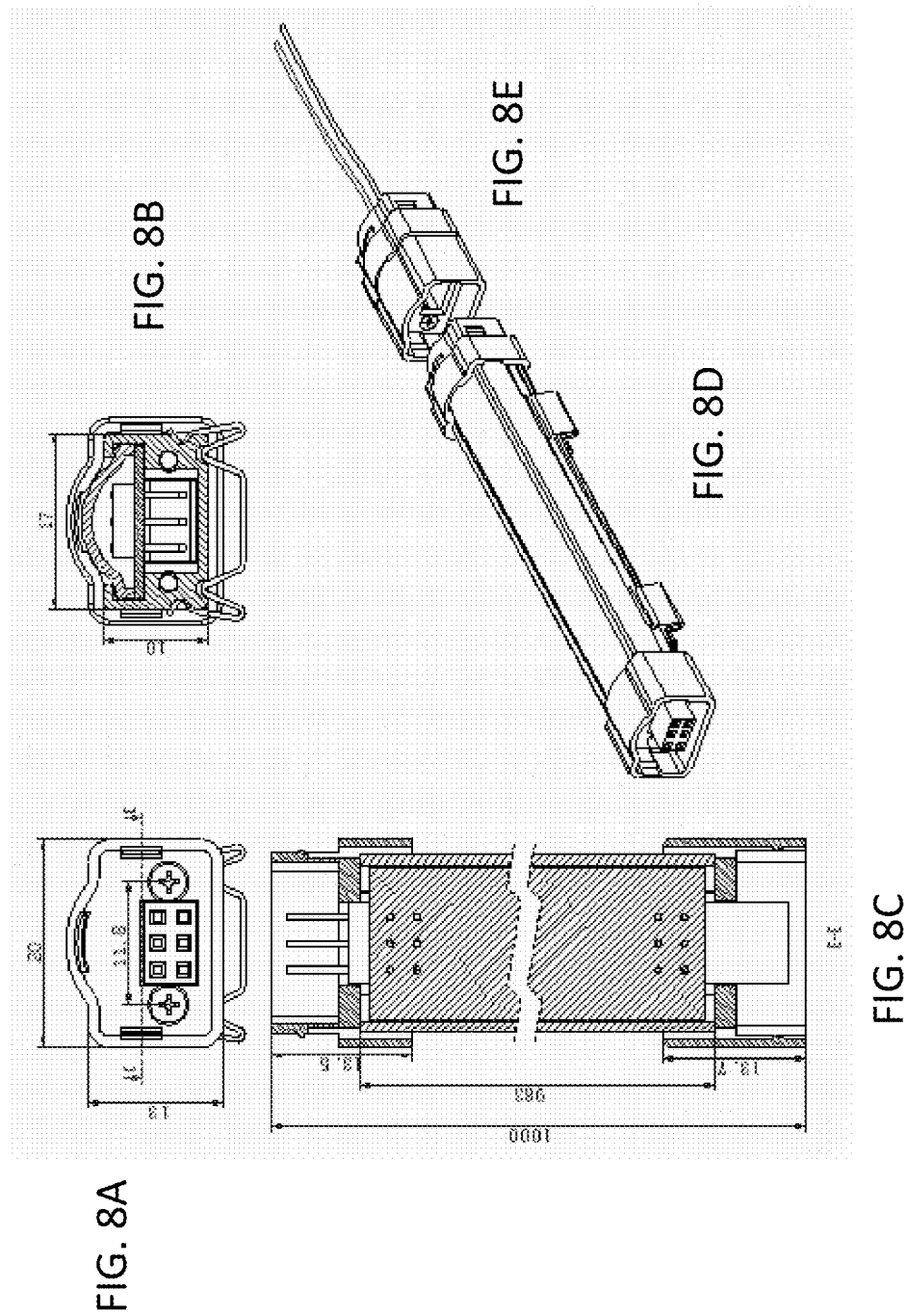

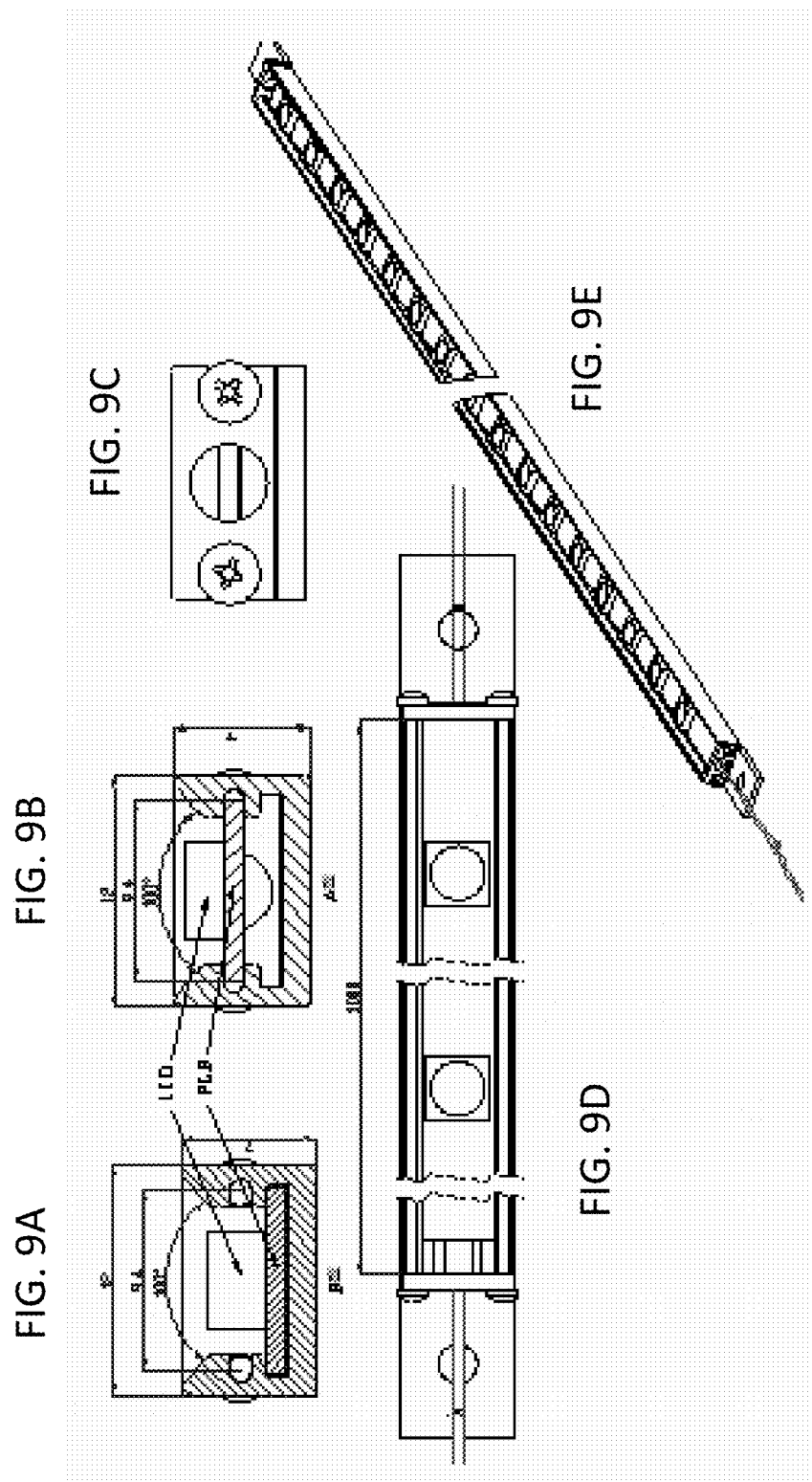

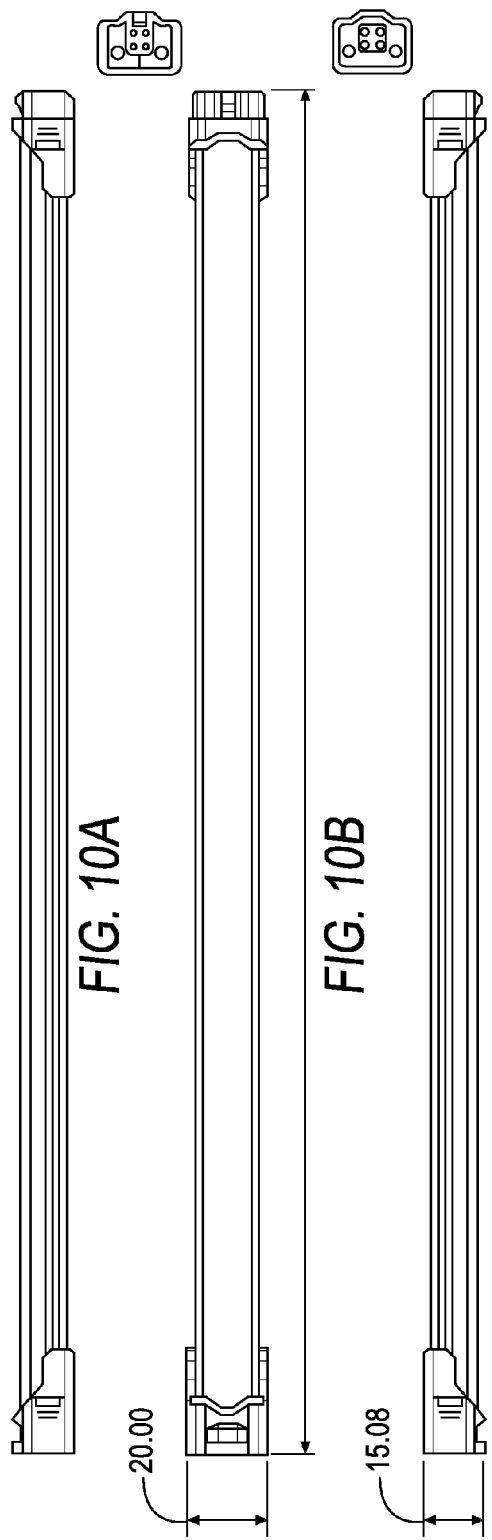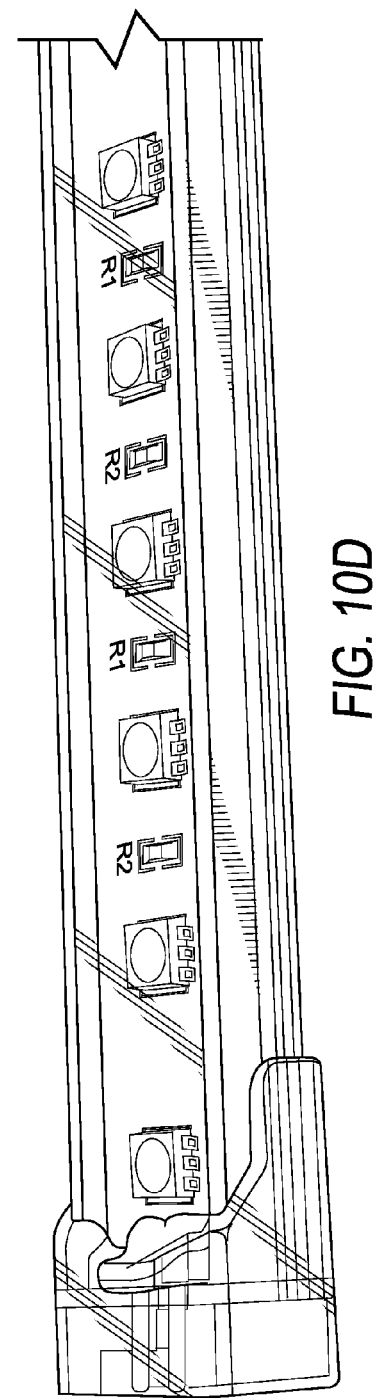
FIG. 10A
FIG. 10B
FIG. 10C
FIG. 10D

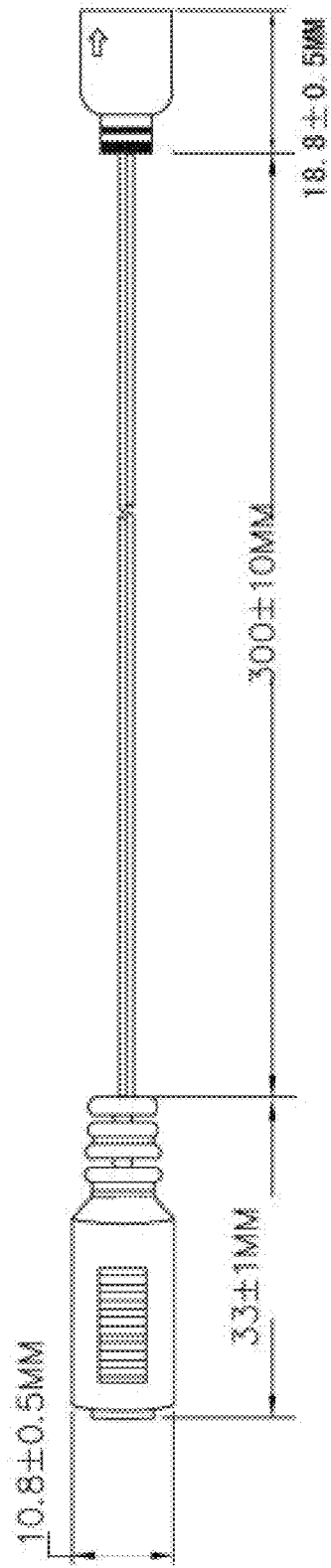
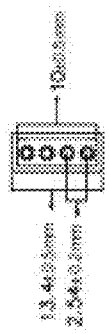
FIG. 11C
FIG. 11A
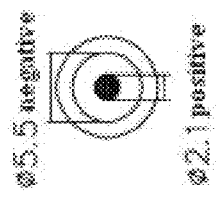
FIG. 11B

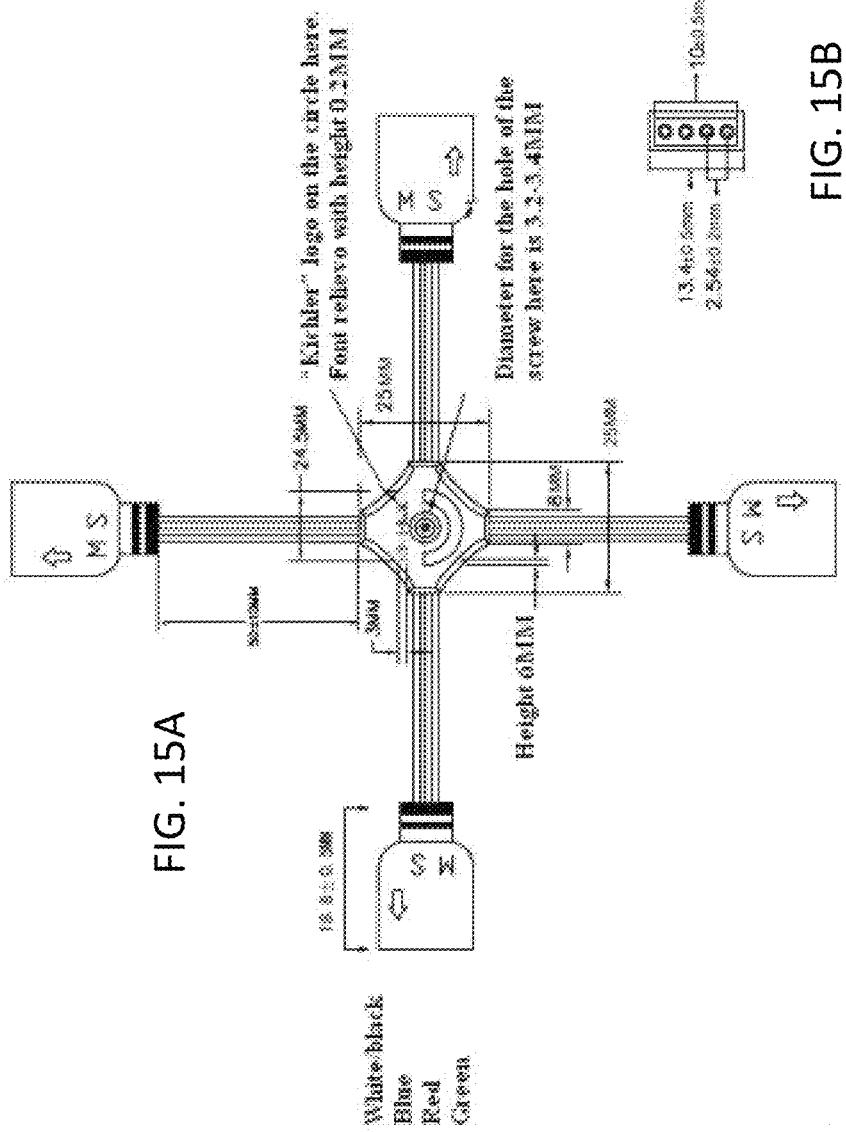

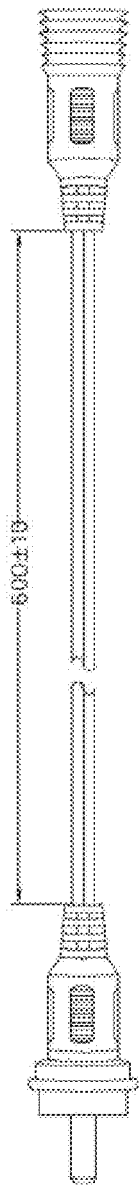
FIG. 17A
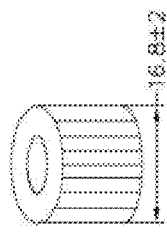
FIG. 17B
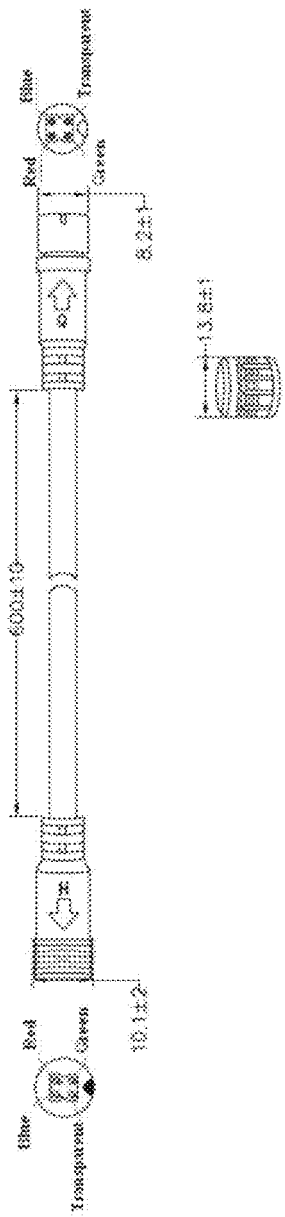
FIG. 18A
FIG. 18B

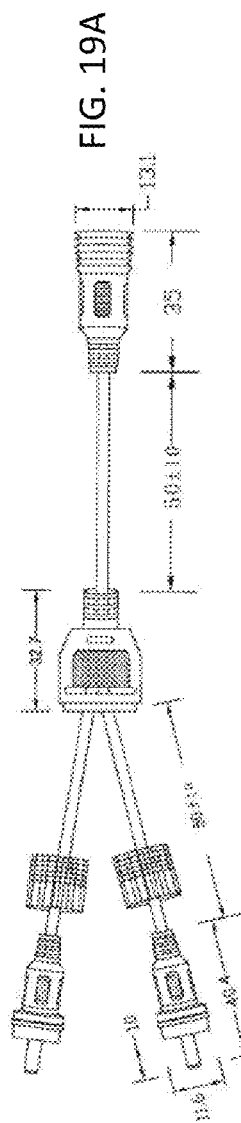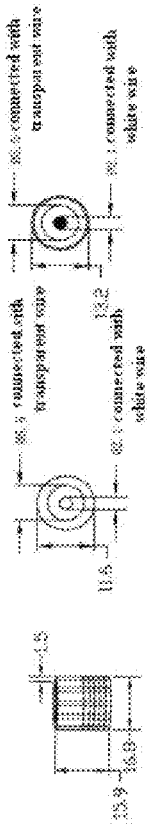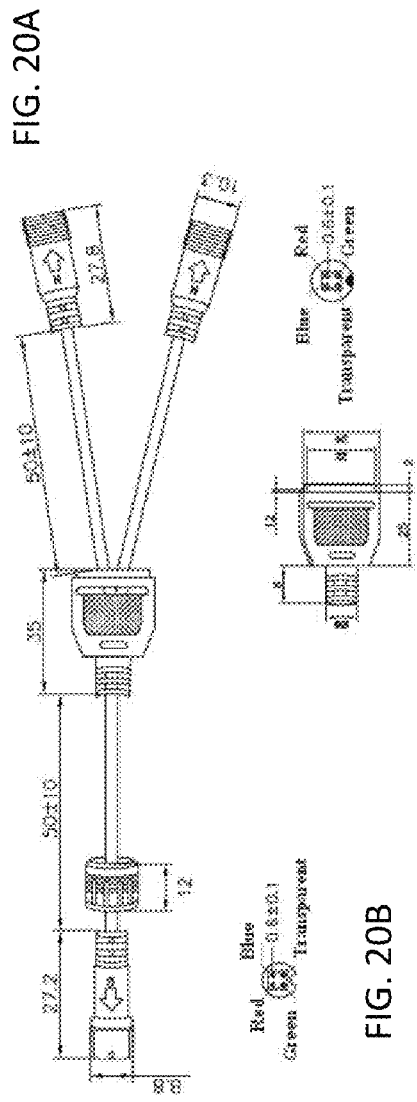

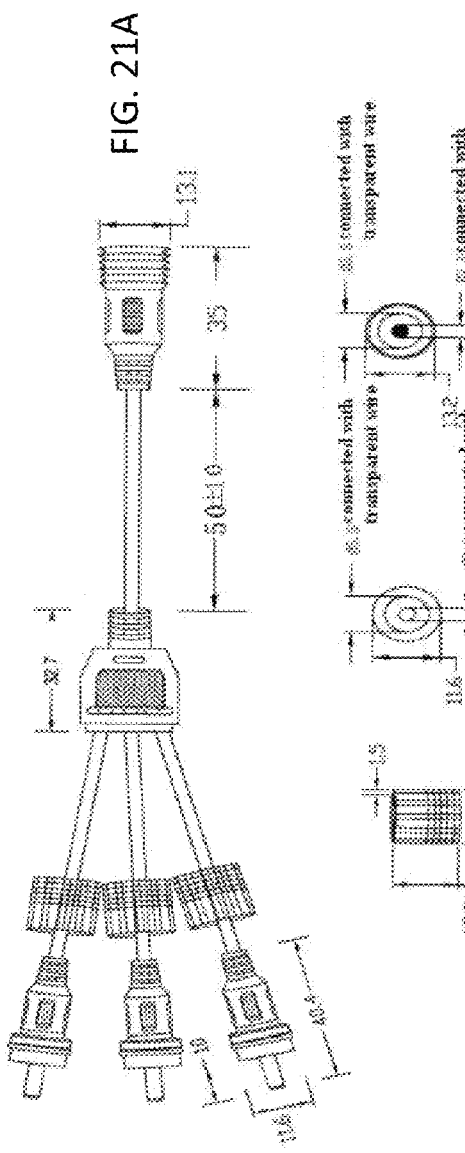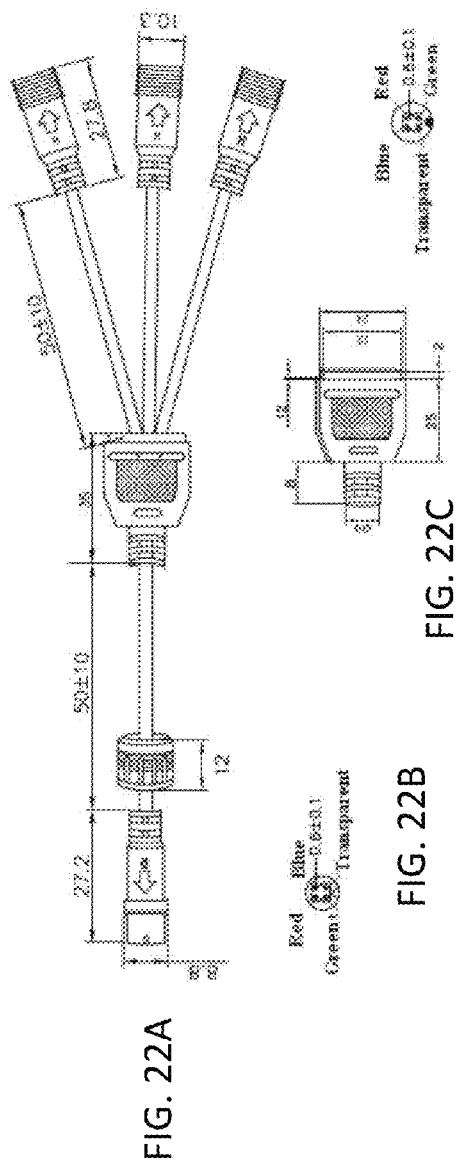

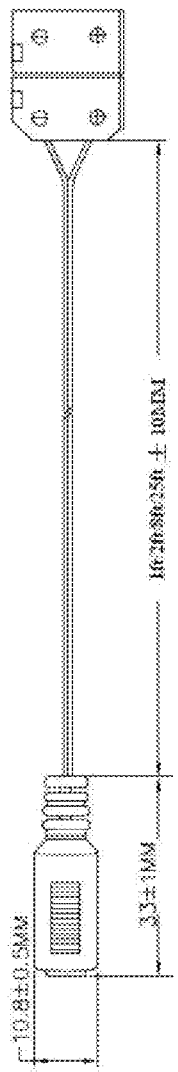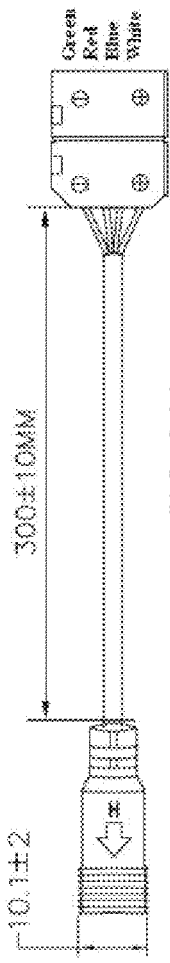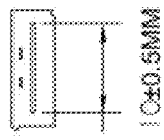
FIG. 23A  FIG. 23B  FIG. 23C  FIG. 24A  FIG. 24B  FIG. 24C

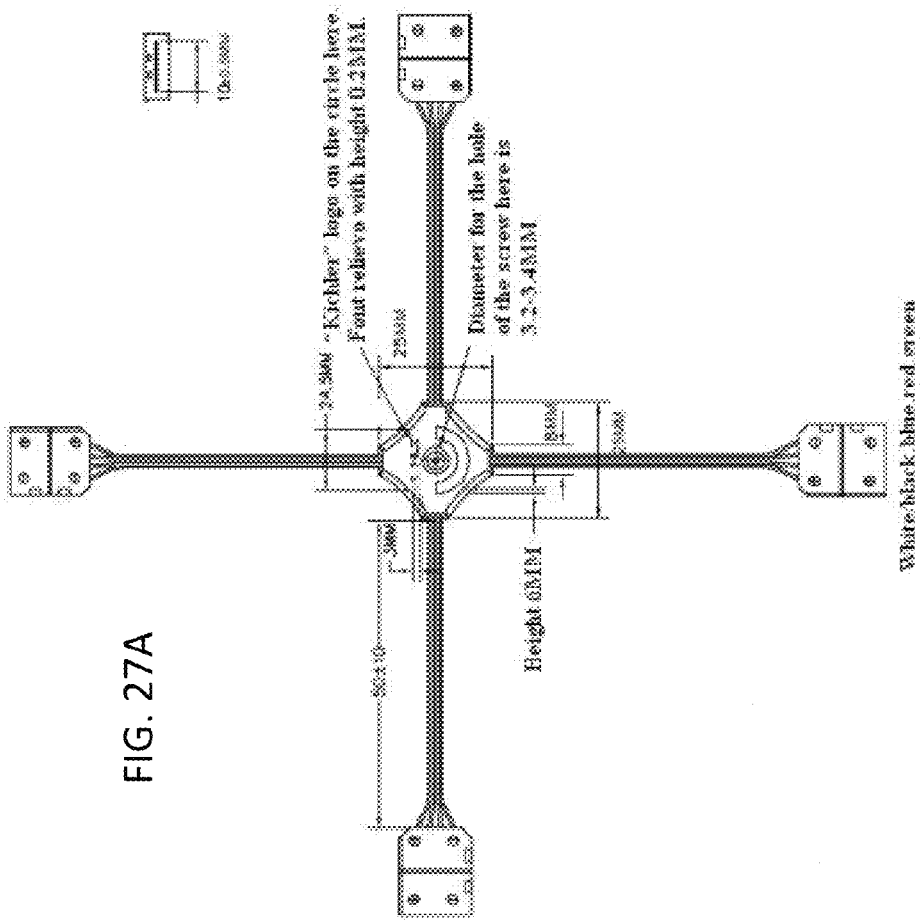

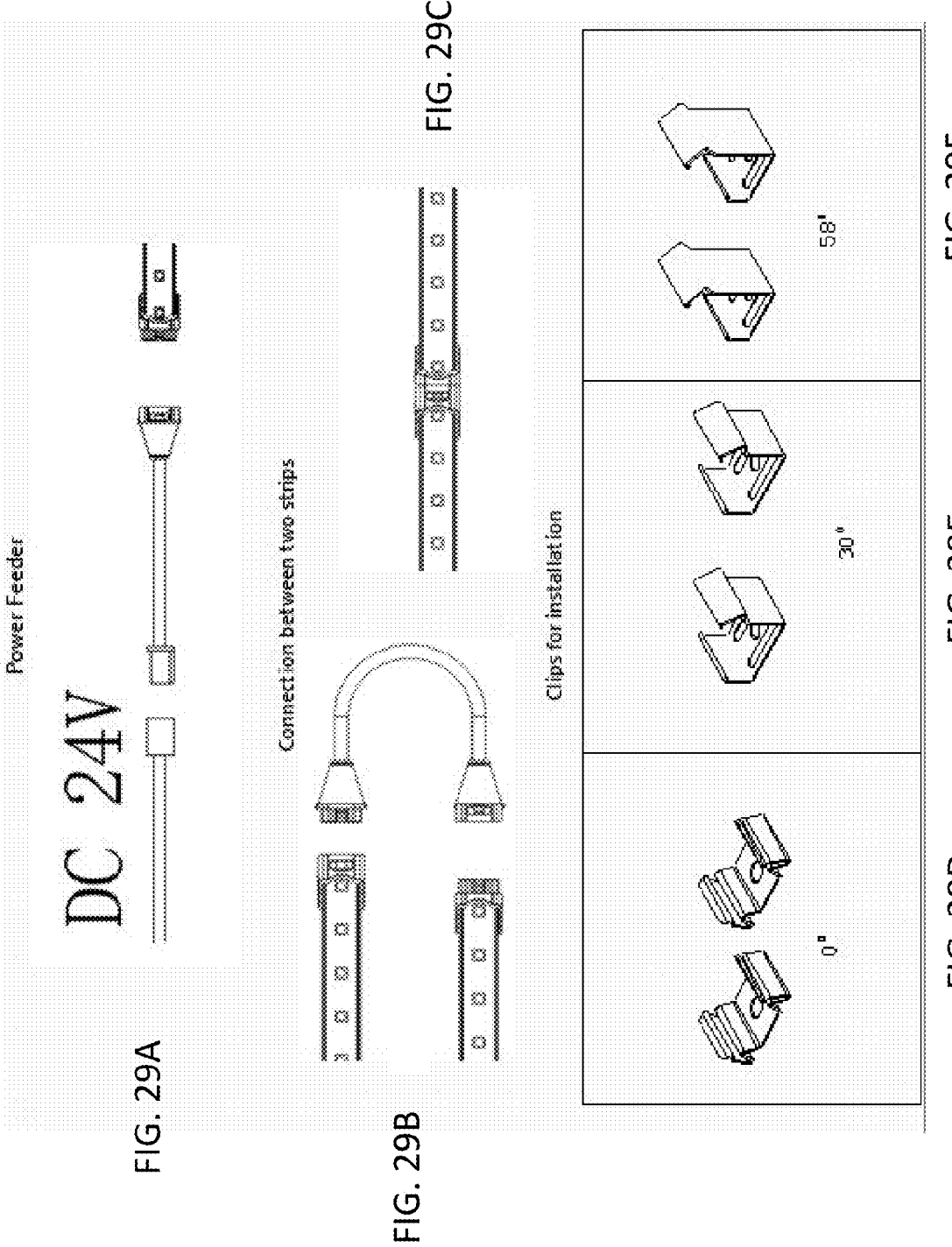

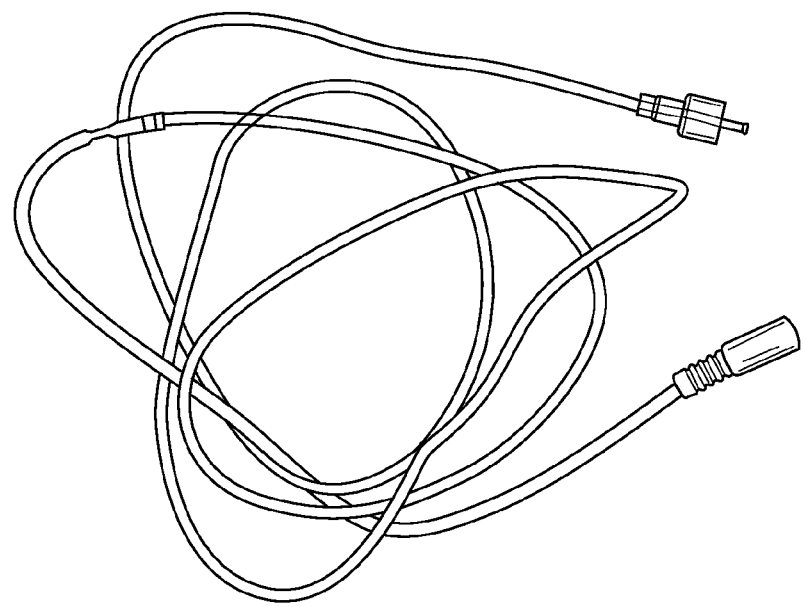
FIG. 30C
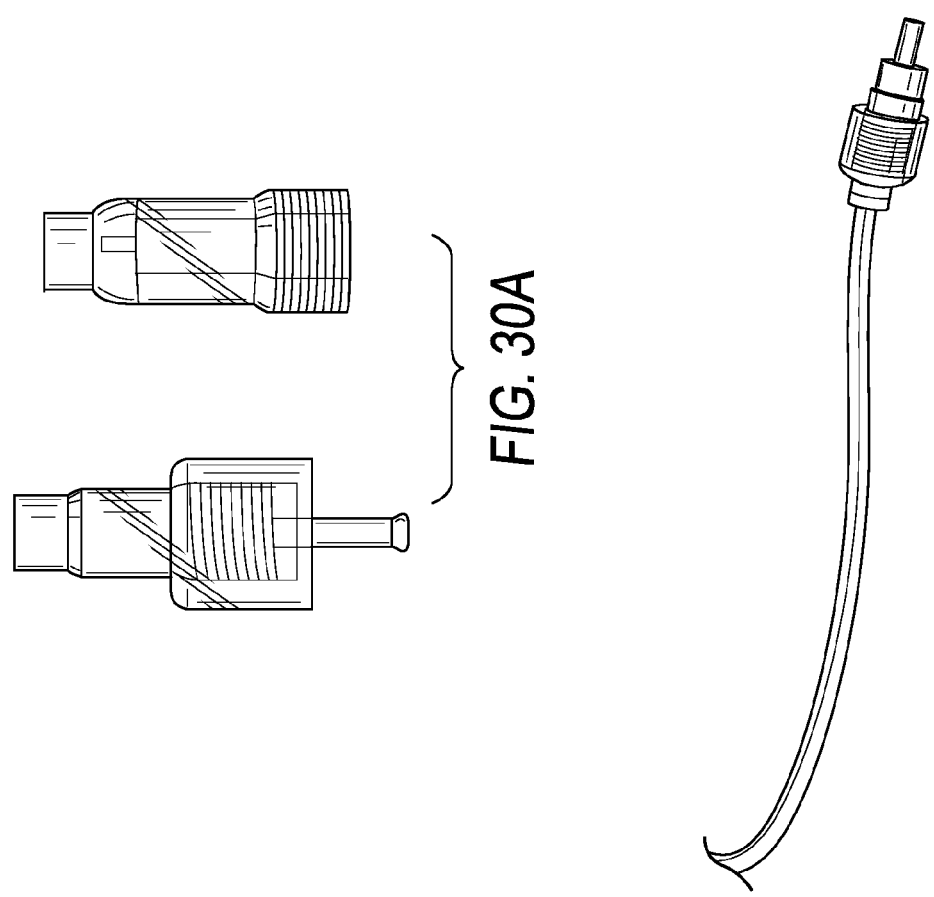
FIG. 30A
FIG. 30B

MODULAR LED LIGHTING SYSTEMS, INCLUDING FLEXIBLE, RIGID, AND WATERPROOF LIGHTING STRIPS AND CONNECTORS

CROSS-REFERENCE TO RELATED APPLICATIONS

This application is a Continuation-in-Part (CIP) of and claims priority to and the benefit of the filing date of parent U.S. application Ser. No. 12/975,112, filed Dec. 21, 2010, which claims priority to and the benefit of the filing date of U.S. Provisional Application No. 61/288,815, filed Dec. 21, 2009, and which parent application is a CIP of U.S. application Ser. No. 12/499,306, filed Jul. 8, 2009, which claims priority to and the benefit of the filing date of U.S. Provisional Application No. 61/079,042, filed Jul. 8, 2008, the disclosures of each of which are hereby incorporated by reference herein in their entireties. This application is also a CIP of and claims priority to and the benefit of the filing date of parent U.S. application Ser. No. 13/106,558, filed May 12, 2011, which claims priority to and the benefit of the filing date of U.S. Provisional Application No. 61/333,806, filed May 12, 2010, and which parent application is also a CIP of U.S. application Ser. No. 12/975,112, the disclosures of each of which are hereby incorporated by reference herein in their entireties.

BACKGROUND OF THE INVENTION

1. Field of the Invention

The present invention relates to lighting strips and more particularly to modular lighting systems comprising lighting devices, for example, lighting strips, physically and electrically connectable with one another by way of a plug and socket integrally formed at opposing ends of the lighting strips. The lighting strip devices can be made of flexible material to allow for applying the lighting devices along flat as well as contoured surfaces. The lighting strips can also be rigid. The lighting strips can also be non-waterproof or waterproof. The present invention further provides connectors for the lighting strips.

2. Description of the Related Art

Modular strip lighting is highly desirable for numerous applications, including as decorative lighting in commercial settings where the lighting is installed for discrete display, especially on contoured surfaces. Often times, such lighting is hidden from view to provide an indirect, softer light source. It is, however, time consuming and difficult to install or repair lighting in places where the technician may not be able to observe where and how the lighting components are installed, but instead must rely only on his hands in the placement of the components. This conflicts tremendously, however, with the desire to minimize downtime for installation and repair of such systems so as not to disrupt the operating schedule of a particular commercial establishment. Further, some types of installations would be impossible to perform in certain circumstances or otherwise extremely time consuming so as not to warrant the repair or installation.

Some existing strip lighting devices and systems provide for installation and repair of sections of flexible lighting strips by providing two cutting points in the strip where the strip can be cut then spliced with a replacement section by using two discrete connectors to connect the ends of the replacement piece to the previously installed lighting strip where the section was removed. As can be imagined, it is especially difficult if not impossible to make this kind of repair in places where the technician can only use his hands, not his eyes, during the repair. For example, without a visual inspection it would be very difficult to determine where to make the needed cuts. Instead, a larger section of the lighting most likely would have to be removed from its point of installation, repaired, and then re-installed, which is burdensome and takes more time leading to longer overall repair times.

For low-profile lighting in hard to reach places, it is cumbersome for the technician to orient the individual connectors in the correct position without visual assistance because the connectors are often too tiny to be able to discern surface differences with only the fingers. For example, some known connectors have small prongs or plugs projecting from the connector which require alignment with small holes in the socket portion of the lighting strip for proper installation. Determining proper alignment in these cases is often difficult and time consuming.

Additionally, known strip lighting systems use connectors that have either two plugs or two sockets. These plug-type connectors will mate with either end of a strip lighting device with complementary socket-type ends. Likewise, these socket-type connectors will mate with either end of a strip lighting device with complementary plug-type ends. Thus, these types of known connectors have two junctions where the circuit of the lighting strip can be connected and disconnected. Having multiple junctions, however, can increase the opportunity for lighting failures, as each junction provides a place where the circuit can be broken, e.g., when the components become loose over time and ultimately disconnected. Accordingly, there is a need to reduce the number of components in strip lighting systems, which in turn provides the advantage that the number of physical and electrical connections in the system is also reduced, which in turn reduces the chance of failure of the entire lighting system by reducing the number of possible failure points. Likewise, the amount of time needed for troubleshooting such types of lighting strip failures is proportional to the number of components in the system, so reducing the number of components can save on repair troubleshooting time.

Further, waterproof modular strip lighting is also highly desirable for numerous applications, including as decorative lighting in exterior settings or interior settings where moisture is common, such as bathrooms, bars, and kitchens. In exterior settings, it is common for installed lighting devices to be exposed to the elements, such as rain, condensation, humidity, or other moisture, as well as extreme temperatures. Lighting devices exposed to moisture and/or extreme temperatures, however, is often at risk for failure. If moisture, especially water droplets, is allowed to contact non-waterproof lighting devices, the water can cause a short circuit or other electrical failure of the device, requiring repair and/or replacement of the failed components.

Waterproofing materials of existing lighting devices typically include as a waterproof colloid layer an epoxy resin for covering the LEDs, electrical circuits and connections, and the substrate. In some cases in existing devices, the epoxy resin or colloid layer does not cover the surface of the LEDs to avoid compromising the light output. By not covering the LEDs, however, there is an increased chance of moisture being introduced into the system where the colloid layer meets the LEDs. This is especially applicable in flexible designs where adherence between the colloid layer and the side of an LED may come loose enough to allow moisture into the system if the strip is flexed repeatedly. Further, in some situations, epoxy resin as colloid layer has been found to be inadequate, such as in extreme temperature situations, including in external weather or environmental conditions or due to the use of high brightness LEDs, which typically have a high heat output during operating of such devices. Under extreme low or high temperatures epoxy resin can craze or become discolored or cloudy, leading to cracks in the waterproof barrier and a decrease in the amount of light output from the device. Better waterproofing materials and techniques are thus desired.

Further, strip lighting that is easy and convenient to install is also highly desirable, especially lighting devices that can be adaptable to various situations. For example, lighting strips that are waterproof, are configured to be cut to a desired length during installation, minimize the number of electrical junctures for a lighting strip system, can be cut and re-connected by way of a waterproof connector, and/or are adaptable to remain waterproof after cutting would be highly desirable, however, existing lighting strip devices and assemblies do not satisfy this need.

Lighting strips and illumination systems such as signs, displays, and other lighting systems have been used for many years. Such signs and displays typically have extended life spans, can be formed to a variety of different shapes and are operative at a relatively low cost. Although lighting systems have been somewhat successful, known lighting systems have encountered certain problems. One known problem is the excessive number of components required to make such lighting systems. Another problem relates to the fragile nature of such lighting systems. Often lighting systems must be individually crafted which increases the purchasing price associated with such lighting systems. Another problem with known lighting systems relates to the lack of convenient interconnectable components of individual lighting sections and the lack of easily removable and securely fit interconnections.

Thus, there remains a need for an improved lighting system and improved connectors which are capable of being interconnected with a variety of lighting strips having a variety of shapes and configurations. In particular, there remains a need for an improved lighting system having light strip sections easily assembled and securely fit interconnections that can be easily removed and interchanged with a number of light strip sections having varying overall shapes. What are also needed are modular, waterproof lighting systems that are easy and quick to install and repair, and/or provide less opportunity for lighting system failures by providing fewer electrical and physical breaks in the circuit of the lighting system, and/or provide for high brightness output of the LEDs, and/or provide for custom fitting of a lighting system to a particular situation while remaining waterproof.

SUMMARY OF THE INVENTION

In light of the problems described above, embodiments of the present invention provide flexible or rigid strip lighting devices, including waterproof or water-resistant devices, that can be combined and conveniently interconnected to form modular lighting systems. Embodiments comprising flexible lighting strips are additionally readily adaptable at the time of installation for various applications and can be repaired quickly and easily when light source failures occur or changes to the lighting system are desired.

Should one or more LED of a lighting strip in a lighting system fail or otherwise need to be replaced, according to embodiments of the invention the entire strip can be removed easily from the system and a new or replacement strip can be inserted in its place. No additional components, such as socket- or plug-type connectors, are needed. Thus, repairs to previously installed lighting can be performed quickly and easily without cutting the installed strip, and/or without measuring a replacement section for the precise length of lighting strip needed for a repair, and/or without fumbling with additional component pieces for re-establishing the circuit.

Included in embodiments of the invention are modular lighting strips comprising: a non-conductive substrate strip comprising an electrical circuit; a plurality of light sources operably connected to the electrical circuit; a plug integrally formed at an end of the substrate strip; and a socket integrally formed at an opposing end of the substrate strip; wherein the plug and socket provide for removable, friction-fit, latchless, and electrical interconnection of two or more circuits. Embodiments of the invention can comprise a latch-type securing mechanism, preferably releasable, for securing the connection between lighting strips when installed but also allowing for convenient disengagement of the components for repairs.

The modular lighting strips of embodiments of the invention can comprise a printed circuit board, such as a flexible printed circuit board, as the substrate strip and electrical circuit. The overall lighting strip can be flexible or inflexible depending on the materials used for construction. For example, the lighting strips can comprise a printed circuit board (PCB) on an inflexible or flexible material, wherein the PCB is supported or not supported by a rigid material, such as a support with heat sink capabilities.

Additional embodiments include modular lighting strips, wherein: the substrate strip is flexible or inflexible; the light sources are light emitting diodes (LEDs); the plug is formed by electrical contacts mounted to an end of the substrate strip and operably connected to the electrical circuit; and the socket is mounted to an opposing end of the substrate strip and comprises a plug hole with internal electrical contacts operably connected to the electrical circuit; wherein the plug and plug hole are oriented lengthwise in relation to the substrate strip and have complementary shapes to provide for interconnection of two or more substrates. Embodiments also include plugs and plug holes that provide for co-planar, side-by-side, end-to-end, parallel, and/or perpendicular interconnection of the substrates, including any plug and plug hole orientation relative to the substrate.

Further included in the invention are modular lighting strips having a low profile appearance, for example, with a height of less than about 3 mm.

It is also possible to cut the modular lighting strips of embodiments of the invention. For example, if desired, it is possible to cut a strip at the time of installation, to provide a length of strip lighting that is less than the length of the modular segment provided in whole. Likewise, the strips can be cut to provide for fewer LEDs than are installed on the entire strip. Cutting can be readily performed, such as at the time of installation of the device(s). Such adaptability and modularity is especially applicable to the flexible lighting devices and systems of the invention but these features are equally applicable to rigid lighting systems and devices as well.

The lighting strips according to embodiments of the invention can be configured so as to provide plug-type ends to the strip at the point of cutting, for example, by providing intermediate electrical contacts at one or more positions along the length of the strip which can be cut to provide two ends each having plug-type electrical contacts which can be operably connected to a socket. The lighting strips can also be cut at any point along the strip where there is no intermediate electrical contact to provide a terminal end of the circuit.

Preferred are modular lighting strips described herein which are about 1 foot in length, and/or comprise up to about 18 LEDs, such as 6, 9, or 18 LEDs, and/or are capable of being operably interconnected with one another to provide up to about 540 light sources from one electrical power supply. The lighting strips can further be interconnected and provided on reels to increase the convenience of installation. Exemplary hard or rigid lighting strips of the invention can be of any length, such as 1 foot, or 2, 3, 4, 5, or 6 feet in length and each can comprise, for example, 10 LEDs and can be interconnected with other strips, such as 4 strips, for providing a modular lighting system having up to 10 LEDs, 20 LEDs, 30 LEDs, 40 LEDs and so forth for example up to about 240 LEDs.

Also provided are connector assemblies for printed circuit boards (PCBs) comprising: a plug integrally formed at one end of a PCB; and a socket integrally formed at an opposing end of the PCB; wherein the plug and plug hole of the socket are oriented lengthwise in relation to the substrate strip and have complementary shapes to provide for removable, friction-fit, and latchless electrical interconnection of two or more substrates. Embodiments also include connector assemblies with plugs and plug holes that provide for co-planar, side-by-side, end-to-end, parallel, and/or perpendicular interconnection of the substrates, including any plug and plug hole orientation relative to the substrate. The connectors, whether integral with or not integral with the substrate, are typically of the male and corresponding or complementary female type, but can be of any known type of connector. It is especially preferred to have at least one female-type connector for one end of the lighting strip and at least one corresponding or complementary male-type connector for the opposing lengthwise end of the substrate.

Especially desired are lighting strip systems having such connector assemblies wherein the installed lighting system has a low profile, e.g., a lighting strip system that rises no more than about 3 mm from the surface to which it is secured.

More specifically, the connector assemblies can be configured to comprise at least one plug formed by electrical contacts mounted to an end of the PCB and operably connected to the PCB; and at least one socket mounted to an opposing end of the PCB which comprises a complementary plug hole with internal electrical contacts operably connected to the PCB.

The PCB of connector assembly embodiments of the invention can be comprised of a flexible, bendable, inflexible, hard, or rigid printed circuit board. The printed circuit board can also be supported by a heat sink to dissipate unwanted heat.

Low profile connector assembly embodiments are also included within the scope of the invention and can include such assemblies having a socket with a height or clearance of less than about 3 mm.

Further, the connector assembly can be configured to be cut, for example at the time of installation of the device, to provide an amount of product that is less than the amount presented at installation. For example, 1-foot strips of product can be cut to lengths less than 1 foot, which may or may not provide for termination of the circuit.

Modular lighting system embodiments are also included in the invention. Such lighting systems can comprise: a modular lighting system comprising: (a) a plurality of modular lighting strips each comprising: a non-conductive substrate strip comprising an electrical circuit; a plurality of light sources operably connected to the electrical circuit; at least one plug integrally formed at an end of the substrate strip; and at least one socket integrally formed at another end of the substrate strip, such as at an opposing end of the substrate strip; wherein the plug and socket provide for removable, friction-fit, latchless, and electrical interconnection of two or more circuits; and (b) a means for operably connecting a modular lighting strip to an electrical power supply for providing power to the light sources, e.g., light emitting diodes. The removable, friction-fit, latchless engagement is typically of the quick-release type and especially preferred are engagements which need no tools for connecting or disconnecting the components.

Means for operably connecting a modular lighting strip to an electrical power supply can be provided by the plug or socket of the lighting strip, wire leads irremovably (or removably) and operably connected to the lighting strip, or a non-conductive substrate strip comprising an electrical circuit and no light sources which is capable of operably connecting to a lighting strip by way of an integrally formed plug or socket. DC jack adapters can be used, and in the case of multi-color light displays for example the red, green, blue LED lighting strips can comprise an RGB-controller for controlling the timing, duration, and changes in color of the display.

Each modular lighting strip can be configured to be any length, with 1-foot, 18-inch, 2-foot, 30-inch, and 3-foot lengths being especially desired. Further, the lighting strips can comprise any number of light sources from 1-500, such as from 5-400, or from 10-300, or from 20-200, or from 30-150, or from 40-120, or from 50-110, or from 60-100, or from 70-90, such as 6, 9, 10, 18, 24, 30, 36, 50, or 100 LEDs for example. Such strips are operably interconnectable to provide up to about 30 feet, for example, from about 15-30 feet, of strip lighting capable of being powered by one electrical power supply.

Embodiments of the invention additionally provide modular lighting systems comprising: at least one first printed circuit board (PCB), optionally comprising at least one operably mounted light emitting diode (LED), wherein the first PCB is capable of being operably connected to a power supply and to a second PCB; at least one second PCB with at least one operably mounted LED, which is capable of being operably connected to the first PCB and optionally operably connected to a third PCB; and one socket or one plug integrally formed on each PCB for operably connecting two consecutive PCBs.

The modular lighting systems can be constructed so that the first PCB is capable of being connected to a power supply by way of a plug, socket, or wire leads irremovably and operably connected to the first PCB.

Further, the modular lighting systems according to embodiments of the invention can comprise about 1-foot long PCBs with LEDs, and/or from about 6-18 LEDs, and/or are operably interconnectable to provide from about 15-30 feet of strip lighting capable of being powered by one electrical power supply.

Any of the modular lighting systems of the invention can be low profile, for example, having a height of less than about 3 mm.

Embodiments of the invention include waterproof flexible and rigid lighting strips that are additionally readily adaptable at the time of installation for various applications and can be repaired quickly and easily when light source failures occur or changes to the lighting system are desired. Such devices and systems can be re-configured for particular situations without compromising the integrity of the waterproof or moisture resistant characteristics.

Portions of the waterproof lighting systems can be replaced should one or more LEDs fail. Simply, a portion of the lighting strip can be cut at predetermined segments and replaced with a new segment having waterproof connectors for interconnecting with the installed lighting strip. Thus, repairs to portions of the installed devices can be made quickly and easily without replacing the entire lighting system and without jeopardizing the waterproof nature of the strips. Similarly, such modifications can be made when necessitated by relocation of a lighting system from one location to another more desirable location.

Included in embodiments of the invention are flexible or rigid modular lighting strips comprising: a non-conductive substrate strip comprising an electrical circuit; a plurality of high brightness LEDs operably connected to the electrical circuit; a colloid coating covering exposed surfaces of the substrate and circuit, and partially or completely covering exposed surfaces of the LEDs; and a plug at one end and a socket at an opposing end of the substrate which is integrally formed, or otherwise operably connected, with the strip to provide for waterproof electrical interconnection of two or more circuits or to a power supply.

Embodiments of the invention can comprise latch-type securing mechanisms, preferably releasable mechanisms, for securing the connection between lighting strips when installed, allowing for convenient disengagement of the components for repairs, and/or allowing for a waterproof or water resistant system.

Included in embodiments of the invention are modular lighting strips comprising: a non-conductive substrate strip comprising an electrical circuit; a plurality of high brightness LEDs operably connected to the electrical circuit; a colloid layer comprising polyurethane resin providing a waterproof coating over one or more or all of the substrate, the circuit, and the LEDs; and a plug at one end and a socket at an opposing end of the substrate which is integrally formed with the strip to provide for waterproof electrical interconnection of two or more circuits or to a power supply. Embodiments of the invention can comprise a latch-type securing mechanism, preferably releasable, for securing the connection between lighting strips when installed but also allowing for convenient disengagement of the components for repairs.

Embodiments of the flexible and rigid lighting systems and devices can comprise a colloid waterproofing layer covering all, most, or some of the device or system. For example, when waterproof LEDs are used the colloid layer need only be applied on the substrate and circuit and contacting or completely covering one or more, all, or less than all surfaces of the waterproof LEDs. A preferred embodiment includes applying the colloid layer to cover the substrate and circuit and a portion of the sides of the LEDs that are typically perpendicular to the substrate, rather than also covering the top of the LED with the colloid layer as well, or only so much of the top of the LED as may be needed to render the lighting device or system waterproof. This may minimize materials costs as well as manufacturing time needed for ensuring a thinner layer of colloid material has set. Waterproofing or making water resistant as much of the devices and systems as possible is preferred.

The modular lighting strips of embodiments of the invention can comprise a printed circuit board, such as a flexible printed circuit board, as the substrate strip and electrical circuit. The overall lighting strip can be flexible or inflexible depending on the materials used for construction. For example, the lighting strips can comprise a printed circuit board (PCB) on an inflexible or flexible material, wherein the PCB is supported or not supported by a rigid material, such as a support with heat sink capabilities. Preferably, the waterproof lighting strips are flexible.

Further included in the invention are modular lighting strips having a low profile appearance, for example, with a height of less than about 3 mm, or having LEDs that have a height of about 3 mm or less.

It is also possible to cut the modular lighting strips of embodiments of the invention. For example, if desired, it is possible to cut a strip at the time of installation, to provide a length of strip lighting that is less than the length of the modular segment provided in whole. Likewise, the strips can be cut to provide for fewer LEDs than are installed on the entire strip. Cutting can be readily performed, such as at the time of installation of the device(s) and a terminal can be installed at the cut end to maintain the waterproof nature of the strip. Such adaptability and modularity is especially applicable to the flexible lighting devices and systems of the invention but these features are equally applicable to rigid lighting systems and devices as well.

The lighting strips according to embodiments of the invention can be configured so as to provide plug-type ends to the strip at the point of cutting, for example, by providing intermediate electrical contacts at one or more positions along the length of the strip which can be cut to provide two ends each having plug-type electrical contacts which can be operably connected to a socket, upon exposing the electrical contacts at the cut end of the substrate by removing a portion of the colloid layer. The lighting strips can also be cut at any point along the strip where there is no intermediate electrical contact to provide a terminal end of the circuit and waterproofed.

Preferred are modular lighting strips described herein which are about 1 foot in length, and/or comprise up to about 18 LEDs, such as 6, 9, or 18 LEDs, and/or are capable of being operably interconnected with one another to provide up to about 540 light sources from one electrical power supply. The flexible lighting strips can further be interconnected and provided on reels to increase the convenience of installation. Exemplary hard or rigid lighting strips of the invention can be of any length, such as 1 foot, or 2, 3, 4, 5, or 6 feet in length and each can comprise, for example, 10 LEDs and can be interconnected with other strips, such as 4 strips, for providing a modular lighting system having up to 10 LEDs, 20 LEDs, 30 LEDs, 40 LEDs and so forth for example up to about 240 LEDs.

Modular lighting system embodiments are also included in the invention. Such lighting systems can comprise: a plurality of modular lighting strips each comprising: a non-conductive substrate strip comprising an electrical circuit; a plurality of high brightness LEDs operably connected to the electrical circuit; a colloid layer comprising polyurethane resin providing a waterproof coating over at least part of each of the substrate, the circuit, and the LEDs; and a plug at one end and a socket at an opposing end of the substrate which operably connected or integrally formed with the strip to provide for waterproof electrical interconnection of two or more circuits.

Means for operably connecting a modular lighting strip to an electrical power supply can be provided by the plug or socket of the lighting strip, wire leads irremovably and operably connected to the lighting strip, or a non-conductive substrate strip comprising an electrical circuit and no light sources which is capable of operably connecting to a lighting strip by way of an integrally formed plug or socket. DC jack adapters can be used, and in the case of multi-color light displays for example the red, green, blue LED lighting strips can comprise an RGB-controller for controlling the timing, duration, and changes in color of the display.

Each modular lighting strip can be configured to be any length, with 1-foot lengths being especially desired. Further, the lighting strips can comprise any number of light sources, such as 6, 9, 10, or 18 LEDs. Such strips are operably interconnectable to provide up to about 30 feet, for example, from about 15-30 feet, of strip lighting capable of being powered by one electrical power supply.

The modular lighting systems can be constructed so that the first PCB is capable of being connected to a power supply by way of a plug, socket, or wire leads irremovably and operably connected to the first PCB.

Further, the modular lighting systems according to embodiments of the invention can comprise about 1-foot long PCBs with LEDs, and/or from about 6-18 LEDs, and/or are operably interconnectable to provide from about 15-30 feet of strip lighting capable of being powered by one electrical power supply.

Any of the modular lighting systems of the invention can be low profile, for example, having a height of less than about 3 mm.

Embodiments of the present invention provide connectors for flexible or rigid strip lighting devices that can be combined and conveniently interconnected with the strip lighting to form modular lighting systems. The connectors can be used with waterproof, water-resistant, or non-waterproof lighting strips.

Connectors of the invention include junctions (plugs and/or sockets) for joining together, electrically and mechanically, one or more lighting strips into a lighting strip system. The connectors can be operably configured to provide 1-way, 2-way, 3-way, 4-way, 5-way, 6-way, 7-way, 8-way (and so on) connection of the lighting strips. A "double" connector, for example, can be operably configured to provide for electrical and physical connection at two junctions, which can be both plug- or socket-type, or one each of a plug-type and a socket-type junction. Another embodiment can comprise a "cross" type connector, which can provide a 4-way intersection of lighting strips. A Y-type connector can provide a 3-way intersection of lighting strips, and so on. The shape of the connector is not critical to the functionality that the connector is capable of providing. For example, a Y-type connector can be Y-shaped and only provide for a 2-way connection, if desired.

Connectors of the invention can comprise two identical sockets joined together at their electrical contacts to form a double connector. In this manner, the same components that are used for the lighting strip sockets can also be used for the connectors thus achieving simplicity in manufacturing, as no special socket components are required. For 3-way and 4-way type sockets, three or four, respectively, identical sockets can be incorporated with a PCB and circuit to for the complex connector. Again, by using standard socket components, a manufacturer can easily make the connectors from existing parts instead of creating another part that cannot be used with other components, such as the lighting strips or connections with a power source through wire leads.

The connectors can comprise any number of plugs and/or sockets, depending mostly on the requirements of a particular desired application for which the connectors are to be used. One embodiment includes a cross-type connector (X-type), operably configured to allow for power to flow through the electrical circuit of the lighting system by having one input and three outputs (i.e., 4-way). Using such a connector, the current traveling through a single lighting strip can enter the connector at one junction and exit the connector at three junctions into three separate lighting strips. Likewise, a 4-way connector can be configured to allow for the flow of current through the connector in a manner which provides two inputs and two outputs through the connector. The number of sockets and/or plugs and/or junctions is not critical, nor is it critical in which direction (in or out) the current flows through the connector within any particular lighting system and all such combinations are possible.

In preferred embodiments, the configuration, including size, shape, and electrical pathway, of the plug of the lighting strips are the same as the plug of the connector and the socket of the lighting strips are the same as the socket of the connector. The connector can be a segment of lighting strip with no LEDs and which is typically shorter in length. The connectors share features of the lighting strips in that the connectors comprise a non-conductive substrate, an electrical pathway (circuit), and plugs and/or sockets for completing the circuit between two or more lighting strips.

Included in embodiments of the invention are modular lighting systems with 1) one or more lighting strips comprising: a non-conductive substrate strip comprising an electrical circuit; a plurality of light sources operably connected to the electrical circuit; a plug or socket integrally formed at opposing ends of the substrate strip; and 2) one or more connectors having one or more plugs or sockets, each operably configured to provide for physical and electrical connection with one or more of the lighting strips. The non-conductive substrates are preferably elongated strips that can be cut to any desired length for a particular application and the light sources on the strip remain operable after cutting.

Preferred embodiments include configurations wherein the plugs and sockets of the lighting strips and connectors provide for removable, friction-fit, latchless, and electrical interconnection of two or more circuits. The connectors can also be joined in a non-removable manner, ie, with adhesive or other mechanical connection that might render the connector or lighting strip unusable one detached from the system, but modular or reusable strips and connectors and most preferred. Other means for securing the lighting strips and connectors together in a lighting system can include overlaying the electrical contacts of the components to be joined and securing them to ensure an electrical connection between the two. Latches can also be used, but are less preferred.

Embodiments of the invention can comprise a latch-type securing mechanism, preferably releasable, for securing the connection between lighting strips and connectors when installed but also allowing for convenient disengagement of the components for repairs.

The modular lighting strips of embodiments of the invention preferably comprise LED-type lighting strips and/or connectors described in Virginia Optoelectronics, Inc.'s U.S. Published Patent Application No. 2010/008090, which also issued as U.S. Pat. No. 8,262,250, entitled "Modular LED Lighting Systems and Flexible or Rigid Strip Lighting Devices," and in U.S. Published Patent Application No. 2012/0002417, entitled "Waterproof Flexible and Rigid LED Lighting Systems and Devices," as well as in U.S. Published Patent Application No. 2011/0255287, entitled "Connectors for LED Strip Lighting," the disclosures of each of which is hereby incorporated by reference herein in its entirety.

The plug and socket components of the lighting systems can be oriented lengthwise in relation to the substrate strip and can have complementary shapes to provide for interconnection of a substrate strip with a connector. Embodiments also include plugs and plug holes that provide for co-planar, side-by-side, end-to-end, parallel, and/or perpendicular interconnection of the substrates, including any plug and plug hole orientation relative to the substrate. The lighting strips can be co-planar and be oriented in any direction relative to one another and/or relative to the connectors. In one embodiment, a lighting strip can be connected with a 4-way connector to continue the circuit of the lighting strip in three separate lighting strips, each of the three oriented in different directions, or each of the three in the same direction parallel to one another. Again, the shape and orientation of the junctions of the connector is typically dictated by a particular lighting system configuration that is desired. For example, if the connector provides for electrical contact from a single lighting strip or electrical source to three lighting strips arranged parallel to one another, the connector could be configured in the shape of a fork, where the input into the connector is represented by the fork handle and the three outputs are represented by the tines.

Also provided are connector assemblies for printed circuit boards (PCBs) comprising: a plug integrally formed at one end of a PCB; and a socket integrally formed at an opposing end of the PCB; wherein the plug and plug hole of the socket are oriented lengthwise in relation to the substrate strip and have complementary shapes to provide for removable, friction-fit, and latchless electrical interconnection of two or more substrates. Embodiments also include connector assemblies with plugs and plug holes that provide for co-planar, side-by-side, end-to-end, parallel, and/or perpendicular interconnection of the substrates, including any plug and plug hole orientation relative to the substrate. The connectors, whether integral with or not integral with the substrate, are typically of the male and corresponding or complementary female type, but can be of any known type of connector. It is especially preferred to have one female-type connector for one end of the lighting strip and a corresponding or complementary male-type connector for the opposing lengthwise end of the substrate.

More specifically, the connector assemblies can be configured to comprise a plug formed by electrical contacts mounted to an end of the PCB and operably connected to the PCB; and a socket mounted to an opposing end of the PCB which comprises a complementary plug hole with internal electrical contacts operably connected to the PCB. The connector can also comprise two plugs or two sockets in such an assembly.

Means for operably connecting a modular lighting strip to an electrical power supply can be provided by the plug or socket of the lighting strip, wire leads irremovably and operably connected to the lighting strip, or a non-conductive substrate strip comprising an electrical circuit and no light sources which is capable of operably connecting to a lighting strip by way of an integrally formed plug or socket. DC jack adapters can be used, and in the case of multi-color light displays for example the red, green, blue LED lighting strips can comprise an RGB-controller for controlling the timing, duration, and changes in color of the display.

The modular lighting systems can be constructed so that the first PCB is capable of being connected to a power supply by way of a plug, socket, or wire leads irremovably and operably connected to the first PCB.

Embodiments of the present invention provide connectors for flexible or rigid strip lighting devices that can be combined and conveniently interconnected with the strip lighting to form modular lighting systems. The connectors can be used with waterproof, water-resistant, or non-waterproof lighting strips.

Connectors of the invention include junctions (plugs and/or sockets) for joining together, electrically and mechanically, one or more lighting strips into a lighting strip system. The connectors can be operably configured to provide 1-way, 2-way, 3-way, 4-way, 5-way, 6-way, 7-way, 8-way (and so on) connection of the lighting strips. A "double" connector, for example, can be operably configured to provide for electrical and physical connection at two junctions, which can be both plug- or socket-type, or one each of a plug-type and a socket-type junction. Another embodiment can comprise a "cross" type connector, which can provide a 4-way intersection of lighting strips. A Y-type connector can provide a 3-way intersection of lighting strips, and so on. The shape of the connector is not critical to the functionality that the connector is capable of providing. For example, a Y-type connector can be Y-shaped and only provide for a 2-way connection, if desired.

Connectors of the invention can comprise two identical sockets joined together at their electrical contacts to form a double connector. In this manner, the same components that are used for the lighting strip sockets can also be used for the connectors thus achieving simplicity in manufacturing, as no special socket components are required. For 3-way and 4-way type sockets, three or four, respectively, identical sockets can be incorporated with a PCB and circuit to for the complex connector. Again, by using standard socket components, a manufacturer can easily make the connectors from existing parts instead of creating another part that cannot be used with other components, such as the lighting strips or connections with a power source through wire leads.

The connectors can comprise any number of plugs and/or sockets, depending mostly on the requirements of a particular desired application for which the connectors are to be used. One embodiment includes a cross-type connector (X-type), operably configured to allow for power to flow through the electrical circuit of the lighting system by having one input and three outputs (i.e., 4-way). Using such a connector, the current traveling through a single lighting strip can enter the connector at one junction and exit the connector at three junctions into three separate lighting strips. Likewise, a 4-way connector can be configured to allow for the flow of current through the connector in a manner which provides two inputs and two outputs through the connector. The number of sockets and/or plugs and/or junctions is not critical, nor is it critical in which direction (in or out) the current flows through the connector within any particular lighting system and all such combinations are possible.

Also provided are connector assemblies for printed circuit boards (PCBs) comprising: a plug integrally formed at one end of a PCB; and a socket integrally formed at an opposing end of the PCB; wherein the plug and plug hole of the socket are oriented lengthwise in relation to the substrate strip and have complementary shapes to provide for removable, friction-fit, and latchless electrical interconnection of two or more substrates. Embodiments also include connector assemblies with plugs and plug holes that provide for co-planar, side-by-side, end-to-end, parallel, and/or perpendicular interconnection of the substrates, including any plug and plug hole orientation relative to the substrate. The connectors, whether integral with or not integral with the substrate, are typically of the male and corresponding or complementary female type, but can be of any known type of connector. It is especially preferred to have one female-type connector for one end of the lighting strip and a corresponding or complementary male-type connector for the opposing lengthwise end of the substrate.

More specifically, the connector assemblies can be configured to comprise a plug formed by electrical contacts mounted to an end of the PCB and operably connected to the PCB; and a socket mounted to an opposing end of the PCB which comprises a complementary plug hole with internal electrical contacts operably connected to the PCB. The connector can also comprise two plugs or two sockets in such an assembly.

Means for operably connecting a modular lighting strip to an electrical power supply can be provided by the plug or socket of the lighting strip, wire leads irremovably and operably connected to the lighting strip, or a non-conductive substrate strip comprising an electrical circuit and no light sources which is capable of operably connecting to a lighting strip by way of an integrally formed plug or socket. DC jack adapters can be used, and in the case of multi-color light displays for example the red, green, blue LED lighting strips can comprise an RGB-controller for controlling the timing, duration, and changes in color of the display.

The modular lighting systems can be constructed so that the first PCB is capable of being connected to a power supply by way of a plug, socket, or wire leads irremovably and operably connected to the first PCB.

The features of novelty and various other advantages that characterize the invention are pointed out with particularity in the claims forming a part hereof. However, for a better understanding of the invention, its advantages, and the objects obtained by its use, reference should be made to the drawings that form a further part hereof, and to the accompanying descriptive matter, in that there is illustrated and described a preferred embodiment of the invention. The features and advantages of the present invention will be apparent to those skilled in the art. While numerous changes may be made by those skilled in the art, such changes are within the spirit of the invention.

BRIEF DESCRIPTION OF THE DRAWINGS

FIGS. 8A-8E are schematic diagrams showing various embodiments of components of rigid light strips.

FIGS. 9A-9E are schematic diagrams showing various embodiments of components of rigid light strips.

FIGS. 10A-10D are schematic diagrams showing various embodiments of components of rigid light strips according to the invention.

FIG. 11A is a schematic diagram showing an embodiment of a 2-way connector for waterproof (indoor damp) light strips.

FIG. 11B is a schematic diagram showing a cross section of a plug component of the 2-way connector embodiment of FIG. 11A.

FIG. 11C is a schematic diagram showing a cross section of a socket component of the 2-way connector embodiment of FIG. 11A.

FIG. 15A is a schematic diagram showing an embodiment of a 4-way connector for waterproof (indoor damp) light strips.

FIG. 15B is a schematic diagram showing a cross-section of a socket component of the 4-way connector embodiment of FIG. 15A.

FIG. 17A is a schematic diagram showing an embodiment of a 2-way connector for waterproof (outdoor wet) light strips.

FIG. 17B is a schematic diagram showing a cap component of the 2-way connector embodiment of FIG. 15A.

FIG. 18A is a schematic diagram showing an embodiment of a 2-way connector for waterproof (outdoor wet) light strips.

FIG. 18B is a schematic diagram showing a cap component of the 2-way connector embodiment of FIG. 15A.

FIG. 19A is a schematic diagram showing an embodiment of a 3-way connector for waterproof (outdoor wet) light strips.

FIG. 19B is a schematic diagram showing a cap component of the 3-way connector embodiment of FIG. 19A.

FIG. 19C is a schematic diagram showing a cross-section of a plug component of the 3-way connector embodiment of FIG. 19A.

FIG. 19D is a schematic diagram showing a cross-section of a socket component of the 3-way connector embodiment of FIG. 19A.

FIG. 20A is a schematic diagram showing an embodiment of a 3-way connector for waterproof (outdoor wet) light strips.

FIG. 20B is a schematic diagram showing a cross-section of a plug component of the 3-way connector embodiment of FIG. 20A.

FIG. 20C is a schematic diagram showing an interface component of the 3-way connector embodiment of FIG. 20A.

FIG. 20D is a schematic diagram showing a cross-section of a socket component of the 3-way connector embodiment of FIG. 20A.

FIG. 21A is a schematic diagram showing an embodiment of a 4-way connector for waterproof (outdoor wet) light strips.

FIG. 21B is a schematic diagram showing a cap component of the 4-way connector embodiment of FIG. 21A.

FIG. 21C is a schematic diagrams showing a cross-section of a plug component of the 4-way connector embodiment of FIG. 21A.

FIG. 21D is a schematic diagrams showing a cross-section of a socket component of the 4-way connector embodiment of FIG. 21A.

FIG. 22A is a schematic diagram showing an embodiment of a 4-way connector for waterproof (outdoor wet) light strips.

FIG. 22B is a schematic diagram showing a cross-section of a plug component of the 4-way connector embodiment of FIG. 22A.

FIG. 22C is a schematic diagram showing an interface component of the 4-way connector embodiment of FIG. 22A.

FIG. 22D is a schematic diagram showing a cross-section of a socket component of the 4-way connector embodiment of FIG. 22A.

FIG. 23A is a schematic diagram showing an embodiment of a 2-way connector for non-waterproof (indoor dry) light strips.

FIG. 23B is a schematic diagram showing a cross-section of a plug component of the 2-way connector embodiment of FIG. 23A.

FIG. 23C is a schematic diagram showing a cross-section of a socket component of the 2-way connector embodiment of FIG. 23A.

FIG. 24A is a schematic diagram showing an embodiment of a 2-way connector for non-waterproof (indoor dry) light strips.

FIG. 24B is a schematic diagram showing a cross-section of a plug component of the 2-way connector embodiment of FIG. 24A.

FIG. 24C is a schematic diagram showing a cross-section of a socket component of the 2-way connector embodiment of FIG. 24A.

FIG. 27A is a schematic diagram showing an embodiment of a 4-way connector for non-waterproof (indoor dry) light strips.

FIG. 27B is a schematic diagram showing a cross-section of a socket component of the 4-way connector embodiment of FIG. 27A.

FIGS. 29A-F are schematic diagrams showing how lighting strips can be connected with a power source (FIG. 29A), and showing embodiments of accessories for lighting strips (FIGS. 29B, 29D, 29E, and 29F), and demonstrating various ways of light strip interconnection (FIGS. 29B and 29C).

FIGS. 30A-C are schematic diagrams showing embodiments of accessories for rigid lights strips of the invention.

DETAILED DESCRIPTION OF VARIOUS EMBODIMENTS OF THE INVENTION

Figure 1A:
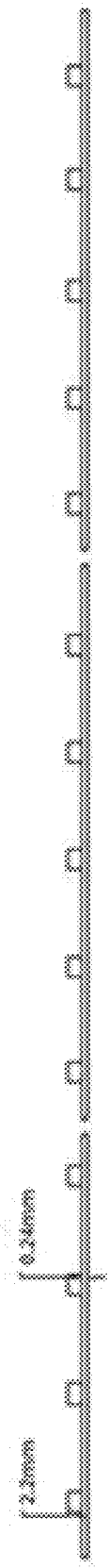
FIG. 1A is a schematic diagram showing a side elevation view of a non-waterproof (indoor dry) flexible light strip according to the invention.

Reference will now be made in detail to various exemplary embodiments of the invention. The following detailed description is presented for the purpose of describing certain embodiments in detail and is, thus, not to be considered as limiting the invention to the embodiments described. Additionally, any features of any embodiment described herein are equally applicable to any other embodiment described herein or envisioned by one of ordinary skill in the art. Thus, the detailed descriptions provided herein should not be construed to exclude features otherwise described with respect to another embodiment.

Particular embodiments according to the invention may include a modular lighting strip comprising: a non-conductive substrate strip comprising an electrical circuit; a plurality of light sources operably connected to the electrical circuit; a plug integrally formed at an end of the substrate strip; and a socket integrally formed at an opposing end of the substrate strip; wherein the plug and socket provide for removable, friction-fit, and electrical interconnection of two or more circuits.

Such modular lighting strips can be operably configured such that the plug and socket are capable of latchless or a latch-type engagement. The modular lighting strips can be flexible or rigid.

According to embodiments, provided is a modular lighting strip comprising any one or more of the features described above, wherein: the substrate strip is flexible; the light sources are light emitting diodes (LEDs); the plug is formed by electrical contacts mounted to an end of the substrate strip and operably connected to the electrical circuit; and the socket is mounted to an opposing end of the substrate strip and comprises a plug hole with internal electrical contacts operably connected to the electrical circuit; wherein the plug and plug hole are oriented lengthwise in relation to the substrate strip and have complementary shapes and provide for latchless interconnection of two or more substrates.

Modular lighting strips can be provided with a substrate strip comprising an electrical circuit and flexible printed circuit board. Any of the lighting strips or connectors can be made non-waterproof, waterproof or water resistant.

Embodiments of the invention provide a modular lighting strip comprising: a non-conductive substrate strip comprising an electrical circuit; a plurality of high brightness LEDs operably connected to the electrical circuit; a water-proof or water-resistant colloid layer disposed partially or completely over the substrate, the circuit, and the LEDs; and a plug at one end and a socket at an opposing end of the substrate operably connected therewith to provide for a waterproof electrical interconnection of two or more circuits. The colloid layer can be a polyurethane resin.

Such lighting strips for example can comprise a substrate strip that is rigid and a colloid layer that provides a waterproof cover for the strip by being disposed in a manner to completely cover any exposed upper surface area of the PCB, to completely cover any exposed electrical circuit, and to partially cover the LEDs up to and excluding an upper surface of the LEDs. Alternatively or in addition, the modular lighting strips can comprise a substrate strip that is flexible and that has a colloid layer that provides a waterproof cover for the strip by encapsulating the upper surface of the PCB, any exposed electrical circuit, and the LEDs in their entirety. Such lighting strips can be intermixed into a system of the invention.

The modular lighting strips of embodiments of the invention can be operatively configured for cutting into smaller segments and/or for providing for a terminal end capable of being waterproofed or for providing an end capable of being operatively connected with another lighting strip.

The modular lighting strip can comprise one or more plug and/or socket that are integral to the lighting strip. Alternatively or in addition, the modular lighting strips can comprise a plug and/or socket connected to the lighting strip with wire lead(s).

According to embodiments, the modular lighting strips can provide for interconnection of two or more circuits that is waterproof and can for example be used for damp or wet indoor and/or outdoor use.

Connectors are also provided by embodiments of the invention, including connectors for modular lighting strips. Such connectors can comprise: two or more plug or socket components operably connected by one or more wires such that during operation in a lighting system power flows through one plug or socket to another plug or socket; wherein the plugs/sockets provide for removable, friction-fit, and electrical interconnection of lighting strips when connected therewith.

Such connectors can comprise one, two, three or more plug or socket components, wherein the one, two, three, four or more plug or socket components are operably connected by flexible wires optionally connected to an electrical interface. The wires for the connectors with two, three, four or more plugs and/or sockets can be arranged in a perpendicular configuration relative to one another, or in a Y-shaped configuration, or in a 1-to-3 branching configuration. Such connectors can be waterproof, non-waterproof, or water resistant.

Particular embodiments will now be described in greater detail. For example, FIGS. 1A-B, 2A-B, 3A-C and 4A-C show various views of embodiments of flexible lighting strips (flex strips) 100, 200, 300, 400 according to the invention. The flex strips 100, 200, 300, 400 comprise a non-conductive substrate strip 101, 201, 301, 401 comprising an electrical circuit (not shown) and a plurality of light sources 102, 202, 302, 402 operably connected to the electrical circuit, such as LEDs. In the embodiments shown in FIGS. 3A-3B and FIGS. 4A-4B, a socket 303, 403 is integrally formed at one end of the substrate strip 301, 401 and a plug 304, 404 is integrally formed at an opposing end of the substrate strip 301, 401, wherein the plug 304, 404 and socket 303, 403 provide for removable, friction-fit, latchless, and waterproof electrical interconnection of two or more electrical circuits. Flex strips 100, 200, 300, 400 are also considered connector assemblies having LED light sources 101, 202, 302, 402 but connector assemblies can comprise other electrical components or simply provide for connection of multiple printed circuit boards.

As shown in FIGS. 1A-B, 2A-B, 3A-C, and 4A-C, the flexible lighting strip 100, 200, 300, 400, whether a single- or multi-color light strip, can comprise a substrate 101, 201, 301, 401 for supporting an electrical circuit (not shown) and a predetermined number of light sources 102, 202, 302, 402. As shown, substrate 101, 201, 301, 401 comprises a flexible material. What is meant by flexible in the context of this application is that the lighting strip can conform to any surface shape to which it is intended to be installed upon. In preferred embodiments, a flexible lighting strip when held in the hand can be manipulated with very little force from the fingers or simply from gravity. If desired, however, substrate 101, 201, 301, 401 of this example could alternatively comprise a rigid material, e.g., a material intended to be installed on a flat surface or otherwise not easily bendable or which requires substantial force to manipulate.

The substrate (e.g., printed circuit board or PCB) for the flexible lighting devices 100, 200, 300, 400 and systems according to the invention can comprise any electrically non-conductive material, such as plastic. The exact materials for the substrate are not critical and options within the skill in the art are available, so long as the substrate provides sufficient support for the components mounted to it (such as LEDs, ICs, and resistors) and the overall lighting devices 100, 200, 300, 400 are flexible and allow for the lighting strip devices 100, 200, 300, 400 to conform to various surface shapes. Such substrates 101, 201, 301, 401 are also referred to as flexible printed circuits or FPCs. The electrically conductive pathway (not shown) can comprise any electrically conductive material such as aluminum or copper. The conductive pathway can be affixed to the PCB 101, 201, 301, 401 by any known means available in the art, including being sandwiched between two layers of electrically non-conductive substrate, so as to provide protection from external elements, such as moisture. Embodiments of the invention include waterproof 300, 400 and non-waterproof or water-resistant 100, 200 lighting strips, and single color 100, 300 and multi-color 200, 400 lighting strips.

Any light source 102, 202, 302, 402 can be used but which is usually dictated by a specific application. Appropriate light sources 102, 302 can include high brightness PLCC-2 SMD LEDs or high brightness PLCC-6 SMD LEDs 202, 402. Such LEDs have a 120 degree viewing angle for even light and are available in various colors, including without limitation white (neutral, cool, and warm), red, yellow, blue, and green. The lighting strips 100, 200, 300, 400 can be constructed to comprise single-color or multi-color light source configurations. For example, the lighting strips can comprise single-color red, yellow, green, blue, cool white, neutral white, or warm white, or multi-color (RGB-color) red, green, and blue colored LEDs. Several color combinations are possible and within the skill of the art. In FIGS. 1A-1B, 2A-2B, 3A-3B, and 4A-4B the light sources 102, 202, 302, 402 can be light emitting diodes (LEDs).

At one end of the light strip shown in FIGS. 3A-3B and 4A-4B, there is a socket-type connector 303, 403. The socket-type connector 303, 403 provides for physical, waterproof connection of two lighting strips 300, 400 and electrical connection of the electrical circuits (not shown) of the strips 300, 400. The socket-type connector 303, 403 can be of any known connector as long as it is capable of providing both physical and electrical connection of the components. The lighting strips 300, 400 also comprise at the opposing lengthwise end of the strip 300, 400 a plug-type connector 304, 404. The plug 304, 404 and socket 303, 403 connectors are complementary configured to provide for mating of the plug 304, 404 of one light strip 300, 400 with the socket-type end 303, 403 of another strip 300, 400. The plug 304, 404 and socket 303, 403 are preferably integrally formed with the substrate 301, 401, for example, by soldering or otherwise adhering the electrically-conductive components of the plug 304, 404 and socket 303, 403 to the electrical circuit of the PCB 301, 401. The plug 304, 404 and socket 303, 403 are operably connected to the electrical circuit of the PCB when their electrical components (wire leads and electrical contacts) are capable of providing for continuity in an electrical path from the circuit of one PCB to the circuit of another PCB during use of the lighting strips. A rubber or plastic sheath can be provided to encase the socket and plug ends of the lighting strips, which are operably configured such that when joined the rubber or plastic sheath protects the plug and socket components from moisture. Additionally, a waterproofing material such as silicone can be disposed between the plug and socket ends when connected together and/or can be disposed around the connection to prevent moisture from entering.

In embodiments, the substrate strip 301, 401 is flexible; the light sources 302, 402 are light emitting diodes (LEDs); the plug 304, 404 is formed by electrical contacts mounted to an end of the substrate strip and operably connected to the electrical circuit; and the socket 303, 403 is mounted to an opposing end of the substrate strip 301, 401 and comprises a plug hole (not shown) with internal electrical contacts operably connected to the electrical circuit; wherein the plug 304, 404 and plug hole are oriented lengthwise in relation to the substrate strip 301, 401 and have complementary shapes to provide for interconnection of two or more substrates 301, 401 and their circuits.

The lighting strips 100, 200, 300, 400 can be manufactured in any length desired, such as 6-inch, 1-foot, or 18-inch lengths, or any length increment for example up to about 6 feet, each length comprising any number of LEDs 101, 102, 103, 104. Further, especially with respect to longer lengths, the substrate 101, 201, 301, 401 can comprise a material that provides for cutting of the flex strips 100, 200, 300, 400 typically at the time of installation, to a shorter length. In one embodiment, lighting strips 100, 200, 300, 400 can be provided in one length with 18 LEDs 102, 202, 302, 402 which is capable of being cut to a shorter length, for example, of 9 LEDs 102, 202, 302, 402 if desired. In particular embodiments of the invention, the single-color lighting strips 100, 200, 300, 400 can be configured to be subsequently cut (typically at installation) into strips 100, 200, 300, 400 comprising 9 LEDs 102, 202, 302, 402 for example for red and yellow colors, and into strips 100, 200, 300, 400 comprising 6 LEDs 102, 202, 302, 402 for example for blue, green, and white colors. The flexible substrate 101, 201, 301, 401 material further facilitates surface mounting of the lighting strips 100, 200, 300, 400, such as a non-planar or curved surface, or around a convex or concave corner. For example, the flexible material enables affixation to a variety of surface shapes, outlines, and contours, including angular, linear, and curved surface shapes.

FIGS. 1A-4A show the low-profile capability of the lighting strips 100, 200, 300, 400. For example, the lighting strip 100, 200, 300, 400, the light sources 102, 202, 302, 402 and/or the socket 303, 403 can be about 3 mm in height or less from the substrate 101, 201, 301, 401. In one embodiment, the lighting strips 100, 200, 300, 400 with the light sources 102, 202, 302, 402 and socket 303, 403 installed can have a height profile of about 3 mm. The light sources 102, 202, 302, 402 can be the same height, shorter, or taller than the socket 303, 403 depending on a particular application. For example, the LED light sources 302 in FIG. 3A are slightly shorter than the socket 303. Further, in one embodiment, for example, the length of the lighting strips 100, 200 can be approximately 16.4 feet and the width approximately 0.0328 feet. Likewise, the height of the LEDs 102, 202 can also be low profile, meaning a height of about 2.5 mm or less, such as about 2.2 mm, or any dimension below approximately 3 mm. In another embodiment, the length of the lighting strips 300, 400 can be approximately 16 ft from the end of the socket 303, 403 and plug 304, 404 and the width approximately 10 mm.

Figure 3A:
FIG. 3A is a schematic diagram showing a side elevation view of an embodiment of a waterproof (indoor damp) flexible light strip according to the invention.
Figure 3B:
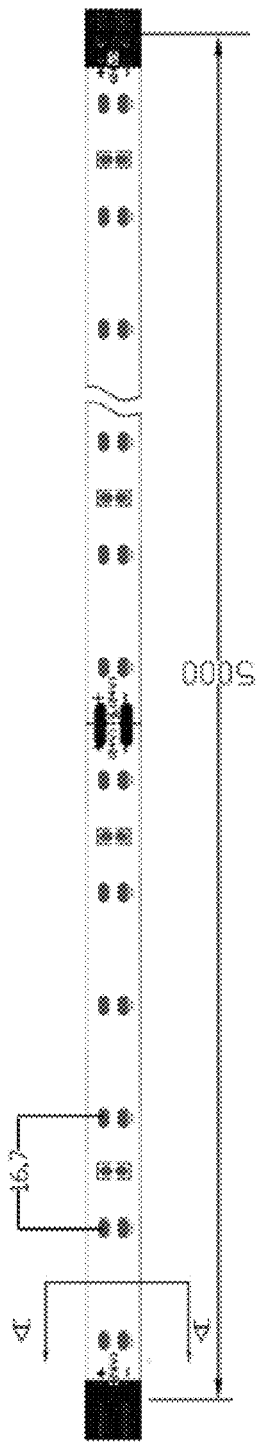
FIG. 3B is a schematic diagram showing a top plan view of an embodiment of a waterproof (indoor damp) flexible light strip according to the invention.
Figure 3C:
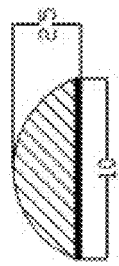
FIG. 3C is a schematic diagram showing a cross-sectional view of an embodiment of a waterproof (indoor damp) flexible light strip according to the invention.
Figure 4A:
FIG. 4A is a schematic diagram showing a side elevation view of another embodiment of a waterproof (indoor damp) flexible light strip according to the invention.
Figure 4B:
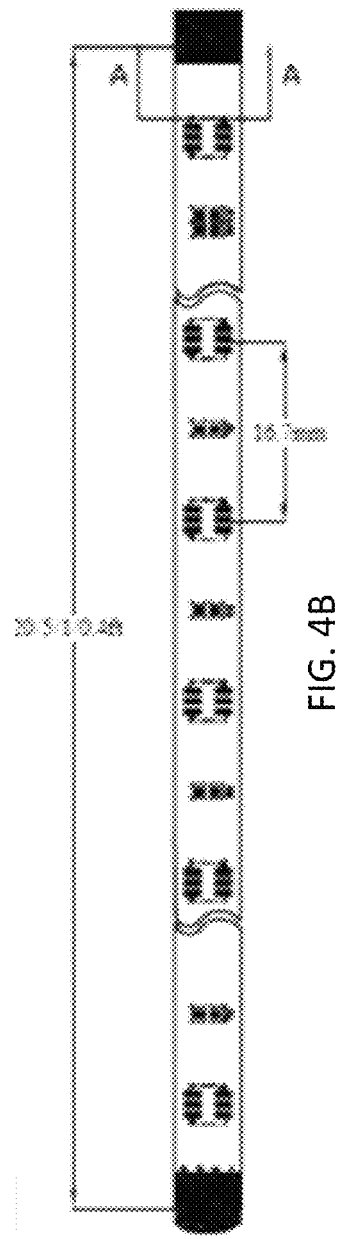
FIG. 4B is a schematic diagram showing a top plan view of another embodiment of a waterproof (indoor damp) flexible light strip according to the invention.
Figure 4C:
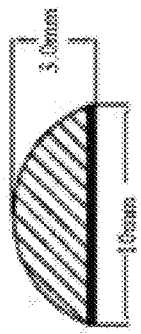
FIG. 4C is a schematic diagram showing a cross-sectional view of another embodiment of a waterproof (indoor damp) flexible light strip according to the invention.

FIGS. 3C and 4C show a cross-sectional view of embodiments of waterproof flexible lighting strips 300, 400 according to the invention. As shown for example in FIGS. 3C and 4C, waterproof flexible lighting strips 300, 400 may have a rounded profile, due to deposition of a waterproof colloid layer on the strips. The colloid layer can be configured in any shape, including having a cross section shaped as a small moon, half moon, big moon, square, rectangle, trapezoid, and so on. The colloid, waterproof, or water-resistant layer can be disposed over the substrate strip, any electrical circuit or contact, and/or on around or on top of the light sources.

Figure 1B:
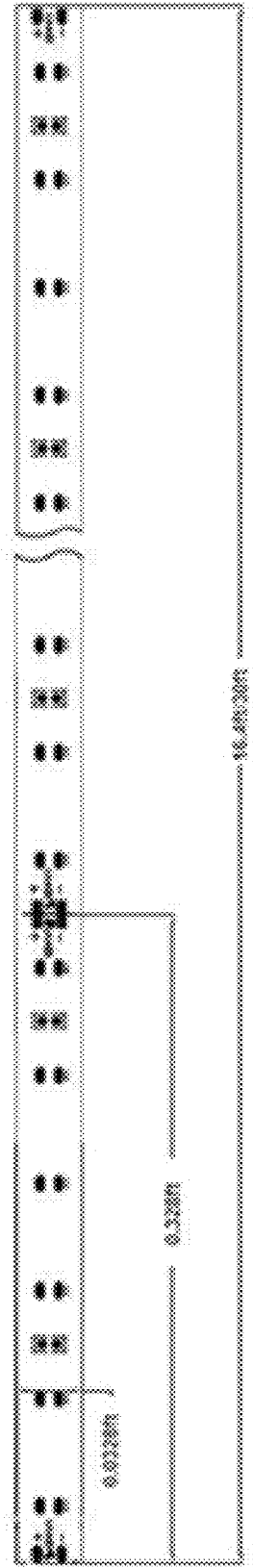
FIG. 1B is a schematic diagram showing a top plan view of the lighting strip embodiment shown in FIG. 1A.

FIGS. 1B and 3B show a top plan view of embodiments of a single color flex strip 100, 300 according to the invention. The flex strip 100, 300 can comprise a substrate 101, 301 flexible or inflexible as with the single color flex strips but preferably flexible. In particular common substrates include printed circuit boards (PCBs) made of flexible plastic. The flex strips 100, 300 can comprise light sources 102, 302 such as one or more colors of PLCC-2 SMD LEDs 102, 302.

Figure 2A:
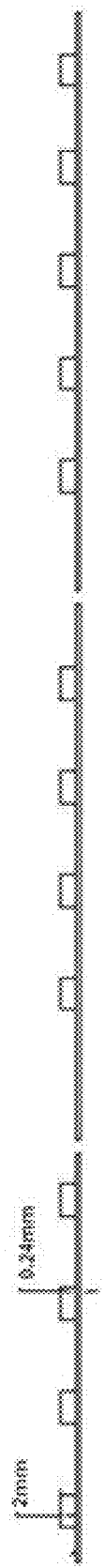
FIG. 2A is a schematic diagram showing a side elevation view of another non-waterproof (indoor dry) flexible light strip according to the invention.
Figure 2B:
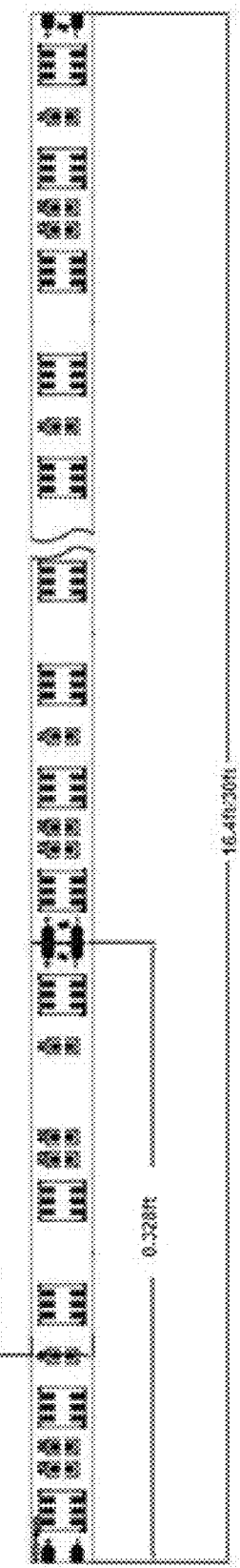
FIG. 2B is a schematic diagram showing a top plan view the lighting strip embodiment shown in FIG. 2B.

FIGS. 2B and 4B show a top plan view of embodiments of a multi color flex strip 200, 400 according to the invention. The flex strip 200, 400 can comprise a substrate 201, 401 flexible or inflexible as with the single color flex strips but preferably flexible. In particular common substrates include printed circuit boards (PCBs) made of flexible plastic. The flex strips 200, 400 can comprise light sources 202, 402 such as one or more colors of PLCC-6 SMD LEDs 202, 402.

FIGS. 3B and 4B show a top plan view of embodiments of waterproof strips. For the waterproof flex strips 300, 400, a socket end 303, 403 lies at one end of the substrate 301, 401 and a plug end 304, 404 lies at the other end of the substrate 301, 401, where both the socket 303, 403 and plug 304, 404 are electrically and physically connected to the substrate 301, 401. A typical type of connection of the plug 304, 404 and socket 303, 403 to the electrical circuit of the substrate 301, 401 is by soldering metal leads from each of the socket 303, 403 and plug 304, 404 to the electrical circuit. Other types of connections may also be appropriate, including connections that can be engaged or disengaged at any time, for example, a releasable connection between the metal leads and lighting strips.

Additionally, the lighting strips of all embodiments of the invention can be configured to be cut at predetermined intervals to provide the desired number of light sources 102, 202, 302, 402 or the desired length of lighting materials for a particular application. Exemplary positions where the strips 100, 200, 300, 400 may be cut are provided at cut indicators 205, 305. Cut indicators can be perforated sections of substrate 101, 201, 301, 401 or markings on the substrate to indicate where a cut may be made. Further for example, in particular embodiments, the lighting strips 100, 200, 300, 400 can be configured with cut indicators, such as those shown for 205, 305 that provide for the substrate strip 201, 301 to be cut into strips comprising 6 LEDs 202, 302. The lighting strips 100, 200, 300, 400 according to embodiments of the invention can be configured to provide plug-type contacts such as those shown for 204, 304 to the strip 201, 301 at a cutting point 205, 305. In particular, for example, intermediate electrical contacts at one or more positions along the length of the substrate 201, 301 can be provided for allowing for two ends each having plug-type 204, 304 contacts when the substrate 201, 301 is cut. Plug ends 204, 304 can then be operably connected to a socket 203, 303. The lighting strips 100, 200, 300, 400 can alternatively or in addition be cut at any point along the substrate 101, 201, 301, 401 where there is no intermediate electrical contact to provide a terminal end of the circuit. To maintain the waterproof characteristics of the strips 300, 400 once cut, a terminal end should be supplied, such as a plastic end that can be joined with the cut end of the substrate with silicone to ensure the end of the strip is waterproof. Alternatively, the substrates 301, 401 can comprise areas where electrical contacts can result as ends of the strips once cut and waterproof socket connectors 303, 403 can be provided to join two plug-type ends 304, 404 of strips that have been cut. To ensure the waterproof nature of strips joined in this way it would be best to seal the juncture between the ends with silicone or other waterproofing material.

Any of the lighting strips 100, 200, 300, 400 of embodiments of the invention can further comprise an adhesive (not shown) for mounting the lighting strips 200 to a surface. For example, the adhesive can be applied to the bottom surface of the lighting strips 200 and temporarily protected with tape which can be removed at the time of installation to expose the adhesive.

The flexible lighting strips 100, 200, 300, 400 can comprise a predetermined number of LEDs 102, 202, 302, 402 mounted to substrate 101, 201, 301, 401 along its length at any interval between the ends, including socket 303, 403 and plug 304, 404. The flex strips can comprise any number of LEDs 102, 202, 302, 402, spaced equally or at different intervals from one another along the length of the substrate 201, such as 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 or more, with 6, 9, or 18 preferred. Indeed, any number of LEDs 102, 202, 302, 402 can be used for each flex strip 100, 200, 300, 400.

Of the flex strips 100, 200, 300, 400 discussed herein, embodiments 100, 200 shown in FIGS. 1A-1B and 2A-2B are non-waterproof (indoor dry) flex strips, and embodiments 300, 400 shown in FIGS. 3A-3C and 4A-4C are waterproof (indoor damp) flex strips. Embodiments 100 shown in FIGS. 1A and 1B preferably use high brightness PLCC-2 SMD LEDs as a lighting source 102. Embodiments 200 shown in FIGS. 2A and 2B use preferably use high brightness PLCC-6 SMD LEDs as a lighting source 202. Embodiments 300 shown in FIGS. 3A-3C preferably use high brightness PLCC-2 SMD LEDs as a lighting source 302. Embodiments 400 shown in FIGS. 4A-4C preferably use high brightness PLCC-6 SMD LEDs as a lighting source 402. Each LED 102, 202, 302, 402 has a 120° viewing angle for even light and may be any color, including red, yellow, green, blue, cool white, neutral white, warm white, and extra warm white. The substrates 102, 202, 302, 402 are preferably a flexible material, enabling to be applied on all accessible surfaces, and may preferably be provided on 5 meter reels (30 pcs LED in 50 cm), which can be cut as the segment based on the cutting mark 105, 205, 305, 405. Embodiments 100, 200, 300, 400 of flex strips preferably have a maximum connection length of 10 meters and are ROHS compliant. Embodiment 100 of non-waterproof (indoor dry) flex strips as shown in FIGS. 1A and 1B may come in a variety of lengths, preferably 16.4 ft and 30 ft., may preferably be 0.0328 ft wide, and may preferably have spacing of cut marks 105 of 0.328 ft. Embodiment 200 of non-waterproof (indoor dry) flex strips as shown in FIGS. 2A and 2B may come in a variety of lengths, preferably 16.4 ft and 30 ft., may preferably be 0.0328 ft wide, and may preferably have spacing of cut marks 205 of 0.328 ft. Embodiment 300 of waterproof (indoor damp) flex strips as shown in FIGS. 3A and 3B may come in a variety of lengths, preferably 0.4 ft, 1.0 ft, 5.0 ft, and 16 ft, may preferably be 10 mm wide, and may preferably have LED 302 spacing of 16.7 mm. Embodiment 400 of waterproof (indoor damp) flex strips as shown in FIGS. 4A and 4B may come in a variety of lengths, preferably 0.4 ft, 1.0 ft, 5.0 ft, and 20 ft, may preferably be 10 mm wide, and may preferably have LED 402 spacing of 16.7 mm.

As shown in FIGS. 5, 6A-C embodiments of single color and multi color waterproof (outdoor wet) flexible lighting strips (flex strip) 500 and 600 are provided. The waterproof flex strips 500, 600 comprise a non-conductive substrate strip 501, 601 comprising an electrical circuit (not shown); a plurality of light sources 502, 602 operably connected to the electrical circuit; a socket 509, 609 operably connected to the electrical circuit of the substrate strip 501, 601 at one end of the flex strip 501, 601, and a plug 510, 610 connected to the electrical circuit of the substrate strip 501, 601 on the opposite end of the flex strip 501, 601 in a manner that provides for a waterproof connection, e.g., by way of wire leads encased in waterproof insulation 507, 508, 607, 608 and connected to the substrate by way of waterproof seals 503, 504, 603, 604. The waterproof seals between the connectors and strips can be integral, releasable, or permanently fixed in operable communication with the strips in a waterproof or water-resistant manner.

Figures 6A, 6B:
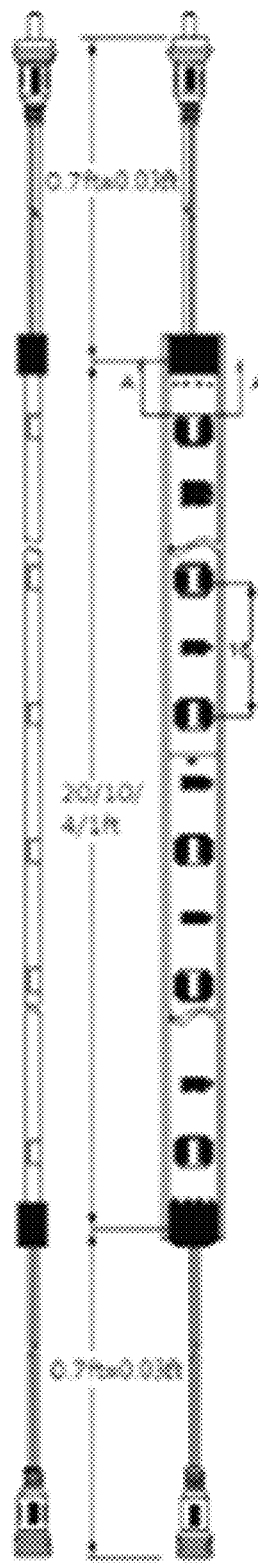
FIG. 6A is a schematic diagram showing a side elevation view of an embodiment of a waterproof (outdoor wet) flexible light strip according to the invention.
FIG. 6B is a schematic diagram showing a top plan view of an embodiment of a waterproof (outdoor wet) flexible light strip according to the invention.
Figure 6C:
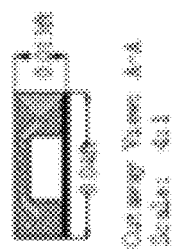
FIG. 6C is a schematic diagram showing a cross-sectional view of an embodiment of a waterproof (outdoor wet) flexible light strip according to the invention.

As shown in FIGS. 3C, 4C, and 6C, cross-sections A-A, a coating 306, 406, 606 may cover and completely encapsulate the upper surface of PCB 301, 401, 601 to provide waterproof protection for the PCB and in particular the electrical components of the lighting strips, which are part of the PCB and/or which are mounted thereon, which may or may not include the light sources such as LEDs. Coating 306, 406, 606 encapsulates the upper surface of substrate 301, 401, 601 to provide for waterproof protection of the electrical components (circuit on PCB and wire leads) of the flexible lighting strips 300, 400, 600. In embodiments, the non-conductive substrate strip can be colored to match or complement the color of the surface to which it will be installed to provide a discrete installed lighting system when installed. Coating 306, 406, 606 may be applied partially or completely to the upper surface of PCB 301, 401, 601 to provide the desired degree of moisture resistance or waterproofing to the system components. For example, the coating 306, 406, 606 may completely cover the PCB 301, 401, 601 and the electrical circuit, contacts, or other electrical components of the devices and partially cover the sides of the LEDs that are perpendicular to the substrate, such as about ¼, ⅓, or ½ of the height of the LEDs. In preferred embodiments, waterproof LEDs are used and/or only enough of the LED is covered to provide waterproof protection to the system. In embodiments, the colloid layer is disposed on the substrate up to a level that is about the level of the upper surface of the LEDs but not covering the LEDs so that light emitted from the device is not affected by the waterproofing material or technique. Such a configuration is applicable to flexible or rigid strip lighting, but will more typically be employed with respect to rigid lighting systems. The waterproofing material can alternatively be disposed in a manner to completely encapsulate the LEDs, by for example covering the entire upper surface of the LEDs as well as the sides of the LEDs.

As shown in cross-sections A-A of FIGS. 3C, 4C, and 6C, coating 306, 406, 606 forms a rectangular profile. Here, coating 306, 406, 606 is a polyurethane resin, which can be applied on the lighting strips in liquid form in a manner to allow for the resin to flow naturally into a rounded profile over the LEDs and substrate. In this embodiment, the polyurethane resin coating 306, 406, 606 is of minimal thickness and just covers the upper surface of the LEDs so as not to interfere with the light output of the LEDs. To obtain cross-sectional shapes that are square or rectangular, a mold can be used to guide and retain the liquid resin in the desired form until the resin can be cured and hardened into the desired shape.

As shown in cross-sections A-A of FIG. 6C, coating 606 forms a rectangular profile. Here, coating 606 is a polyurethane resin, which can be applied on the lighting strips in liquid form in a manner to allow for the resin to flow naturally into a profile over the LEDs and substrate. In this embodiment, the polyurethane resin coating 606 is of minimal thickness and just covers the upper surface of the LEDs so as not to interfere with the light output of the LEDs. In embodiments, the height of the resin can be twice that of the height of the LEDs, or half that of the LEDs, or even up to four or more times the height of the LEDs.

Figure 5:
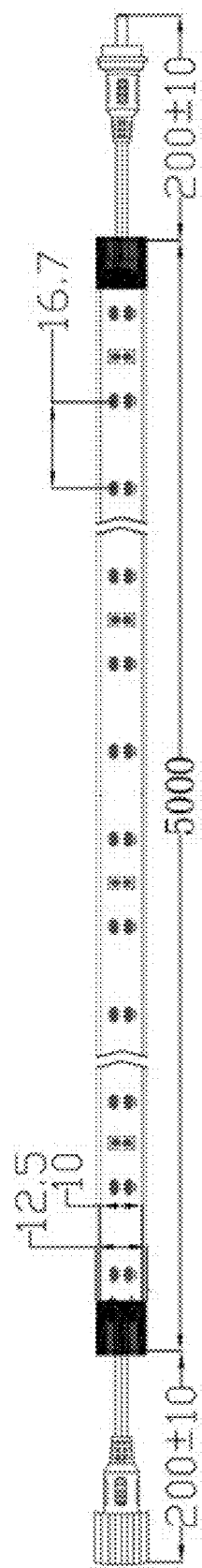
FIG. 5 is a schematic diagram showing a top plan view of an embodiment of a waterproof (outdoor wet) flexible light strip according to the invention.

While not shown, similar coatings may be used to waterproof the embodiment shown in FIG. 5, and all disclosure concerning coatings applicable to the embodiments shown in FIGS. 6A-6C are applicable to the embodiment shown in FIG. 5.

One technique for applying the colloid layer is to allow the material to form freely on the surface of the PCB and/or to provide gently rocking of the PCB while the material dries to ensure complete coverage of the components. Molds or guides can also be used to prevent overflow of the liquid colloid material over the edges of the PCB, or to ensure complete coverage of the PCB by the colloid material, or to allow for the application to be performed using a more fluid solution of colloid material. For example, temporary walls can be placed lengthwise along the sides of the PCB to form a temporary cavity within which the LEDs sit on the PCB. Liquid colloid material can then be applied in the cavity and allowed to settle by way of gravity or in combination with gentle rocking of the PCB. Once the colloid material has set in the desired position, the temporary supports, guides, or walls can be removed, leaving a colloid layer on the PCB which has a square or rectangular cross section. Further, for example, the temporary guides can be combined as a single tool, basically forming a structure with two walls disposed at a right angle (or any angle less than 180 degrees) to one another. This tool can then be inverted over the PCB on the side with the LEDs to form a cavity defined by the two walls and the PCB. Liquid or semi-liquid colloid material can then be injected into the cavity and allowed to dry or form on the PCB, circuit, and or LEDs. Once the colloid layer is formed or otherwise sufficiently stiff, the colloid shaping tool can be removed, leaving the colloid layer having a trapezoidal cross section on the PCB, with its side walls perpendicular to one another or said another way having slopes between the upper colloid surface and the PCB of opposing 45 degrees. Multiple shapes for the colloid layer can be achieved by modifying this technique appropriately and by using a corresponding or complementary tool. For example, the colloid layer can be configured in any shape, including having a cross section shaped as a small moon, half moon, big moon, square, rectangle, trapezoid, and so on.

The colloid layer is typically a material that is transparent when solid and has a high tolerance for low and high temperatures, such as polyurethane resin, or any other suitable light transmissive encapsulation material. Any such waterproofing material can be used that is flexible, non-conductive, allows for a desired amount of light to be emitted from the device, and/or can tolerate extreme temperatures, for example, from −10 degrees Celsius to 40 degrees Celsius. The material can be a sheath surrounding the components, but is preferably disposed directly on the PCB, LEDs, and electrical circuit for the most protection. Optically clear materials can be used, such as silicone gels. Materials that do not degrade (or that resist discoloration) when exposed to ultra-violet (UV) light are included. Further examples include polymethylmethacrylate (PMMA), epoxy or silicone resins, polycarbonate, nylon, and silicone rubber.

If desired, the colloid layer may be colored to add or otherwise change the color of the light output from the LEDs. Likewise, the PCB can be colored to match a surface to which it is intended to be applied to camouflage or otherwise reduce the aesthetic impact an installed lighting system may have. For example, if a lighting system is to be installed on white walls, the PCB can be colored white so that when installed on the wall surface the lighting strip blends in well with its surrounding.

The waterproof lighting strips 300, 400, 500, 600 can be connected with other lighting strips 300, 400, 500, 600 by way of connectors comprising an integral female end 303, 403 or an extended female end 509, 609 and an integral male end 304, 404 or an extended male end 510, 610 for example, at opposite ends of each lighting strip 300, 400, 500, 600. When the connector 303, 403, 509, 609 of one lighting strip is joined with connector 304, 404, 510, 610 of another lighting strip, waterproof seal 503, 504, 603, 604 ensures the connection is waterproof on lighting strips 500, 600 with extended connectors 509, 510, 609, 610. Extended connectors 509, 609 and 510, 610 are operably connected to the PCB 501, 601 by way of wire leads 507, 508, 607, 608 which are operably connected to electrical contacts at either end of the PCB, wherein the wire leads are protected with insulating/waterproofing material. Preferably, connectors 509, 609 and 510, 601 together with insulation, seals 503, 504, 603, 604 and coating material combine to provide waterproof protection for a flexible lighting system with multiple lighting strips 500, 600.

The waterproof flex strips can be single-light strips or multi-color light strips and can comprise any predetermined number of light sources 302, 402, 502, 602. Substrate or PCB 301, 401, 501, 601 comprises a flexible material. Flexible in the context of this application is that the lighting strip can conform to any surface shape to which it is intended to be installed upon, and/or can be rolled and retained on a reel for ease in dispensing longer lengths of lighting strip systems during installation. In preferred embodiments, a flexible lighting strip when held in the hand can be manipulated with very little force from the fingers or simply from gravity.

The substrate (e.g., printed circuit board or PCB) for the flexible waterproof lighting devices 300, 400, 500, 600 and systems according to the invention can comprise any electrically non-conductive material, such as plastic. The exact materials for the substrate are not critical and options within the skill in the art are available, so long as the substrate provides sufficient support for the components mounted to it (such as LEDs, ICs, and resistors) and the overall lighting devices 300, 400, 500, 600 are flexible and allow for the lighting strip devices 300, 400, 500, 600 to conform to various surface shapes. Such substrates 301, 401, 501, 601 are also referred to as flexible printed circuits or FPCs. The electrically conductive pathway (only partially shown) can comprise any electrically conductive material such as aluminum or copper. The conductive pathway can be affixed to the PCB 301, 401, 501, 601 by any known means available in the art, including being sandwiched between two layers of electrically non-conductive substrate.

Any light source 302, 402, 502, 602 can be used but which is usually dictated by a specific application. Appropriate light sources can include high brightness PLCC-2 SMD LEDs 302, 502 and PLCC-6 SMD 402, 602 LEDs. Likewise, 3528 SMD LEDs may be used as well as 5050 RGB SMD LEDs for particular applications.

The polyurethane resin as the colloid layer 306, 406, 506, 606 makes high brightness LEDs possible in these lighting strip applications. The polyurethane resin is capable of withstanding extreme high and low temperatures without crazing and thereby jeopardizing the waterproof nature of the strips and/or the quality of light emitted from the devices. Such SMD LEDs have a 120 degree viewing angle for even light and are available in various colors, including without limitation white (neutral, cool, and warm), red, yellow, blue, and green. The lighting strips 300, 400, 500, 600 can be constructed to comprise single-color or multi-color light source configurations. For example, the waterproof lighting strips 300, 400, 500, 600 can comprise single-color red, yellow, green, blue, cool white, neutral white, or warm white or multi-color (RGB-color) red, green, and blue colored LEDs. Several color combinations are possible and within the skill of the art. In FIGS. 3A-3B, 4A-4B, 5, and 6A-6B the light sources 302, 402, 502, 602 can be light emitting diodes (LEDs).

At one end of the light strips shown in FIGS. 3A-3B, 4A-4B, 5, and 6A-6B there is a socket-type connector 303, 403, 509, 609. The socket-type connector 303, 403, 509, 609 provides for physical connection of two lighting strips 300, 400, 500, 600 and electrical connection of the electrical circuits (not shown) of the strips 300, 400, 500, 600. The socket-type connector 303, 403, 509, 609 can be of any known connector as long as it is capable of providing both physical and electrical connection of the components and a waterproof connection of these components. The lighting strips 300, 400, 500, 600 also comprise at the opposing lengthwise end of the strip 300, 400, 500, 600 a plug-type connector 304, 404, 510, 610. The plug 304, 404, 510, 610 and socket 303, 403, 509, 609 connectors are complementary configured to provide for mating of the plug 304, 404, 510, 610 of one light strip 300, 400, 500, 600 with the socket-type end 303, 403, 509, 609 of another strip 300, 400, 500, 600. As shown in FIGS. 5 and 6A and 6B, the socket and plug can be of various configurations, including a round quick-release type plug and socket with an internal rubber gasket for maintaining the waterproof connection between the plug and socket.

The plug 304, 404 and socket 303, 403 may be integral to the lighting strips 300, 400 as shown in FIGS. 3A-3B and FIGS. 4A-4B, or, in other embodiments, the plug 510, 610, and socket 509, 609 comprise wire leads in insulation wrapping 507, 607, 508, 608 for soldering or otherwise adhering or operably connecting the electrically-conductive components of the plug 510, 610 and socket 509, 609 to the electrical circuit of the PCB 501, 601. The plug 510, 610 and socket 509, 609 are operably connected to the electrical circuit of the PCB when their electrical components (wire leads and electrical contacts) are capable of providing for continuity in an electrical path from the circuit of one PCB to the circuit of another PCB during use of the lighting strips. The connection between the connecting ends of the lighting strips and the PCB in embodiments is preferably be waterproof and/or water resistant.

The waterproof lighting strips 300, 400, 500, 600 can be manufactured in 6 inch, 1-foot, or 18-inch lengths, or any length increment, including 1.6 feet, each length comprising any number of LEDs 302, 402, 502, 602. In embodiments, the waterproof lighting strips can be 2 feet, 3 feet, 4 feet, or even longer. Further, especially with respect to the longer lengths, the substrate 301, 401, 501, 601 can comprise a material that provides for cutting of the flex strips 300, 400, 500, 600 typically at the time of installation, to a shorter length. In one embodiment, lighting strips 300, 400, 500, 600 can be provided in one length of 1.6 feet (or 50 cm) with 30 LEDs 109 (single color), or 18 LEDs (multi-color), which is capable of being cut into smaller segments. The strips can be joined with other strips and packaged on reels. A preferred embodiment of reels of lighting strips provides 16 feet of lighting strips (10 1.6-foot strips), which provides for a lighting system of 300 single-color LEDs or 180 multi-color LEDs. Further preferred are lighting systems comprising up to 32 feet of lighting strips, or 600 single-color LEDs or 360 multi-color LEDs. Another preferred configuration is a 5M long lighting strip, capable of being cut at indicated points, comprising 300 LEDs. One or more of the lighting strips can be joined together to form a lighting system, such as combining two 5M lengths into a lighting system that is 10M and comprises 600 LEDs.

FIGS. 3C, 4C, and 6C show cross-section A-A of views which emphasize the low-profile capability of the lighting strips 300, 400, 600. For example, the PCB 301, 401, 601 and light sources 302, 402, 602 when encapsulated or covered by coating material 306, 406, 606 (as well as PCB 501 and light sources 502, which may be similarly coated) can be about 3 mm in height or less. Combining low-profile characteristics with high brightness is a challenge to LED lighting manufacturers. Typically, as brightness increases, so does the size of the LED. As a particular example, an LED that is 0.5 mm or less in height typically will not be able to output the same amount of light as an LED with a 2.5 mm profile. Thus, obtaining lighting strips which are as low-profile as possible but as bright as possible is difficult, and is further complicated by the desire to have such lighting devices be waterproof. Thus it is highly desirable to have lighting strips that are waterproof and comprise LEDs that are greater than 0.5 mm high, but less than 3 mm high. Any height LED from 1 mm, 1.5 mm, 2 mm, 2.5 mm, 2.6 mm, 3 mm, 3.5 mm, 4 mm, etc. would be possible with this invention.

Waterproof (outdoor wet) flex strip embodiments 500 shown in FIG. 5 preferably use 3528 SMD LEDs as a lighting source 502. Waterproof (e.g., outdoor) flex strip embodiments 600 shown in FIGS. 6A-6C preferably use high brightness PLCC-6 SMD LEDs as a lighting source 602. Each LED 502, 602 has a 120° viewing angle for even light and may be any color, including red, yellow, green, blue, cool white, neutral white, warm white, and extra warm white. The substrates 501, 601 of embodiment 500, 600 are preferably a flexible material, enabling to be applied on all accessible surfaces. Embodiment 500 may preferably be provided on 16.4 ft rolls (18 LEDs/ft), which can be cut into segments based on the cutting marks (not shown). Embodiment 600 may preferably be provided in 5 meter reels (300 LED pcs/reel), which may be cut into segments based on the cutting marks (not shown). Embodiments 500, 600 of flex strips preferably have a maximum connection length of 32.8 ft or 6 meters and may be ROHS compliant. Embodiment 500 of waterproof (outdoor wet) flex strips as shown in FIG. 5 may come in a variety of lengths, preferably 5 meters, may preferably be 10 mm wide, and preferably the length of the plug 510 and wire 508 or socket 509 and wire 507 may be 200+/−10 mm. Embodiment 600 of waterproof (outdoor wet) flex strips as shown in FIGS. 6A-6C may come in a variety of lengths, preferably 1 ft, 4 ft, 10 ft, or 20 ft, may preferably be 0.04 ft wide, and preferably the length of the wire 607 and socket 609 or wire 608 and plug 610 may be 0.7 ft+/−0.03 ft. LED 502, 602 spacing may preferably be 16.7 mm.

Representative optical and electrical parameters for embodiments of non-waterproof and waterproof single-color LED flex strips according to the invention include those listed in Tables 1-4 below.

TABLE 1

Representative Optical Parameters at Ta = 77° F. of Single-Color LED Flex Strips (Waterproof or Non-Waterproof) Using High Brightness PLCC-2 SMD LED as Lighting Source

| Color | LED Quantity [pcs]/reel | Viewing angle [°] | Wavelength (color temperature) | Luminous Flux [lm]/ft | LED Quantity [pcs]/segment |
|---|---|---|---|---|---|
| Red | 300 | 120 | 625 nm | 30 | 6 |
| Yellow | 300 | 120 | 590 nm | 30 | 6 |
| Green | 300 | 120 | 515 nm | 58 | 6 |
| Blue | 300 | 120 | 470 nm | 20 | 6 |
| Cool white | 300 | 120 | 6500 K ± 500 K | 120 | 6 |
| Neutral white | 300 | 120 | 4000 K ± 300 K | 110 | 6 |
| Warm white | 300 | 120 | 3000 K ± 300 K | 100 | 6 |
| Extra warm white | 300 | 120 | 2700 K ± 200 K | 100 | 6 |

TABLE 2

Representative Electrical Parameters of Single-Color LED Flex Strips (Waterproof or Non-Waterproof) Using High Brightness PLCC-2 SMD LED as Lighting Source

| Parameters | Symbol | Values | Unit |
|---|---|---|---|
| Operating Voltage | Vopr | 24 (+5%) | V |
| Power Dissipation Max (V = 24 VDC) | PD | 1.45 (+5%)/ft | W |
| Operating Temperature | Topr | −20-+55 | ° C. |
| Storage Temperature | Tstg | −30-+85 | ° C. |

TABLE 3

Representative Optical Parameters at Ta = 77° F. of Single-Color LED Flex Strips (Waterproof or Non-Waterproof) Using High Brightness PLCC-6 SMD LED as Lighting Source

| Color | LED Quantity [pcs]/reel | Viewing angle [°] | Wavelength (color temperature) | Luminous Flux [lm]/ft | LED Quantity [pcs]/segment |
|---|---|---|---|---|---|
| Red | 300 | 120 | 625 nm | 88 | 6 |
| Yellow | 300 | 120 | 590 nm | 88 | 6 |
| Green | 300 | 120 | 515 nm | 144 | 6 |
| Blue | 300 | 120 | 470 nm | 65 | 6 |
| Cool white | 300 | 120 | 6500 K ± 500 K | 220 | 6 |
| Neutral white | 300 | 120 | 4000 K ± 300 K | 210 | 6 |
| Warm white | 300 | 120 | 3000 K ± 300 K | 200 | 6 |
| Extra warm white | 300 | 120 | 2700 K ± 200 K | 200 | 6 |

TABLE 4

Representative Electrical Parameters of Single-Color LED Flex Strips (Waterproof or Non-Waterproof) Using High Brightness PLCC-6 SMD LED as Lighting Source

| Parameters | Symbol | Values | Unit |
|---|---|---|---|
| Operating Voltage | Vopr | 24 (+5%) | V |
| Power Dissipation Max (V = 24 VDC) | PD | 4 (+5%)/ft | W |
| Operating Temperature | Topr | −20-+55 | ° C. |
| Storage Temperature | Tstg | −30-+85 | ° C. |

Figure 7A:
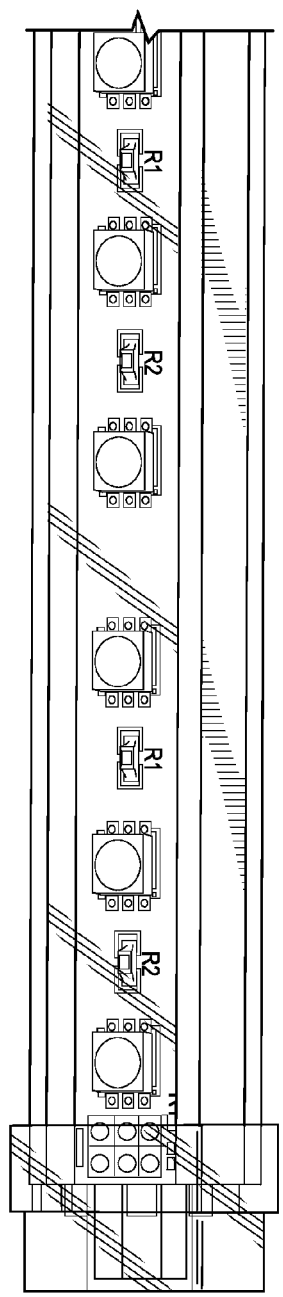
FIGS. 7A-7C are schematic drawings showing embodiments of rigid light strips with integral plugs and sockets.
Figure 7C:
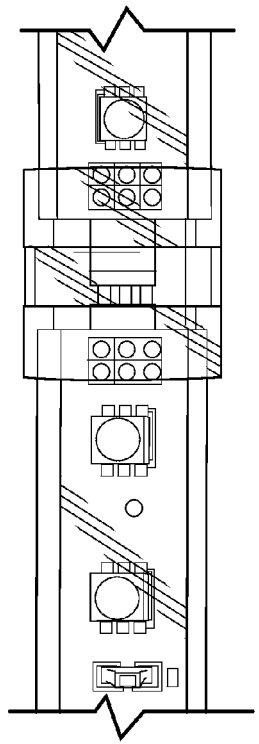
Figure 7B:
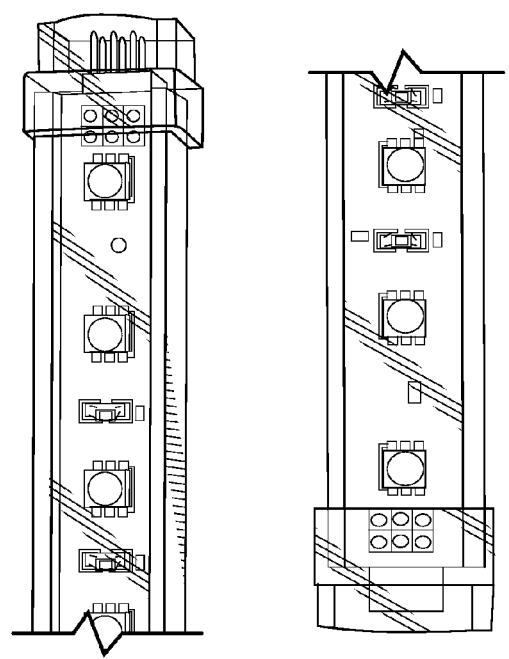

FIGS. 7A-7C show hard (or rigid) lighting strips according to the invention with plugs and sockets that are integral to the strips. FIG. 7A shows a perspective view of an exemplary plug-type 704 end of one lighting strip, FIG. 7B shows a perspective view of an exemplary socket-type 703 end of one lighting strip 700 and a plug-type 704 end of another strip 700 unconnected, while FIG. 7C shows two lighting strips 700 (lighting system) connected. The socket 703 in this embodiment comprises a plug hole, which provides for a releasable connection between the socket 703 and plug 704. In this embodiment, both the plug 704 and socket 703 comprise electrical contacts so that the electrical circuit of the substrate 701 can be continued through the male and female connectors 703, 704 during use. Although not required, a releasable connection between the socket 703 and plug 704 ends is preferred, so that once a lighting system (one or more lighting strips capable of being interconnected) is installed, repairs and changes can be made quickly and easily by releasing the connection between components to exchange an installed component for a new or replacement component. A preferred embodiment for the releasable connection between socket 703 and plug 704 can be obtained by providing electrical contacts within plug hole at a position where friction fit with electrical contacts of the plug 704 is made possible.

One embodiment provides for the electrical contacts within the plug hole to be oriented at opposing sides of the hole and with just enough spacing between them to provide for direct physical and friction fit contact between contacts of the plug hole and plug 704 when the plug 704 is inserted into the hole of the socket 703. In embodiments, the connectors 703, 704 can be configured to be connected at installation but permanently or otherwise difficult to disconnect once installed, such as by soldering the components together or by using a latch-type engagement. Here, socket 703 comprises structure capable of engaging hole 713 of plug end 704. Once engaged, prongs and holes 713 on either sides of their respective connector ends can be disengaged by pressing the prong back out of hole 713. The latch is one type of quick-release latch that can be used. Changes or repairs to an installed lighting system are more convenient when there is no latch or a quick-release latch connecting the components. Also, in this embodiment the female end 703 is integrally formed with the rigid lighting strip 700 preferably at one lengthwise end of each strip 700, while the male end 704 is integral with the opposing end of strip 700.

Figure 7D:
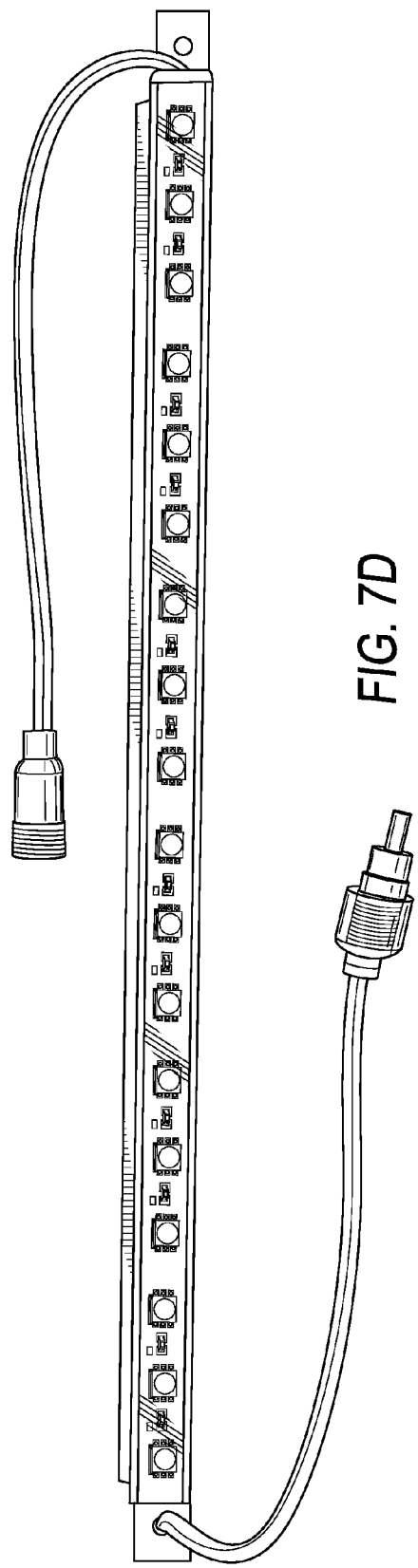
FIG. 7D is a schematic diagram showing an embodiment of a rigid light strip with extended plugs and sockets joined to opposing ends of the light strips for flexible interconnection of two or more lighting strips or a light strip with a connector for joining the light strip or lighting strip system to a power source.

FIG. 7D shows an embodiment of hard (or rigid) lighting strips according to the invention with a plug 704 and socket 703 extended from the strip 700 by a connecting wire 709. To provide a waterproof connection, the wire may be covered with insulation and plugs and sockets may be configured to provide a waterproof fit.

FIGS. 8A-E show various views of components of an embodiment of hard (or rigid) lighting strips 800 according to the invention. As shown in FIG. 8E, lighting strip systems 800 can comprise wire leads 809 for connection to a power source. In embodiments, wire leads 809 are permanently attached to an adapter 816 or directly to the strip 800 and provide electrical power to flow through the electrical circuit of lighting strip 800. The adapter 816 comprises structure for engaging and connecting with lighting strip 800, namely prongs 812 or holes 813, which interact with a corresponding element on strip 800. Each lighting strip 800 comprises at least one male end 804 and at least one female end 803 (attached by way of securing means, such as screws 814 in this embodiment), which ends respectively comprise electrical contact prongs 817 or plug holes 806 for releasable, friction-fit engagement. Lighting strips 800 can further comprise heat sink 815 and/or support 819. Support, or hanging board 819, can be used as an intermediate structure for supporting the lighting strips 800 during use on a surface. In this embodiment, support 819 is screwed to a surface, while once installed the lighting strips can be engaged or disengaged with the quick-release support mechanism of the support 819 to make repairs and installation more convenient. Embodiments may include a transparent cover 818 for protection of substrate 801 and optoelectrical components of the system. One embodiment of the cover 818 can comprise clear colored and transparent plastic. Cover 818, as shown, can have a contoured surface and/or can function as a lens for directing or otherwise controlling light from light sources 802. The contoured surface can be continued throughout the lighting strip system in the connectors 803, 804 to ensure a secure yet releasable fit between the components. This embodiment is an example of a non-waterproof lighting strip according to the invention, such as a water resistant lighting strip system.

A preferred embodiment of the rigid lighting strips according to the invention is a non-waterproof system, comprising lighting strips 800 having a substrate strip housing 815 (which may or may not have heat sink capabilities), wherein the substrate strip, typically a PCB 801 with multiple LEDs can be slideably engaged with the housing 815 for ease of manufacturing. A housing cover 818 can also be included, which can have a contoured surface for maintaining some clearance over LEDs 802, yet provide for an overall low profile device. The cover 818 is preferably also slideably engagable with the housing 815 and during manufacturing can be inserted separately or simultaneously into housing 815 with substrate 801. Connectors 803, 804 have an interior profile complementary to housing 815 and cover 818 to which the connectors are integrally formed (by screws 814, adhesive, solder, or other difficult to release type securing means. The overall device 800 of this embodiment has a compact configuration and is low profile due to its unique shape. For installing the lighting strips 800 to a surface, a hanging board 819 is provided. This support 819 can be secured to a surface by way of adhesive or screws for example and the lighting strips 800 inserted, removed, and re-inserted at the installer's convenience. The hanging board 819 in this embodiment comprises snap-fit type securing means, which provides for quick-release of the lighting device from the surface to which it is installed.

FIGS. 9A, 9B, 9C, 9D, and 9E show various views of a rigid lighting system according to the invention. In this embodiment, high brightness 0.5 W SMD PLCC-6 LEDs can be used for the light sources 902. The LEDs 902 are mounted to a substrate 901, which is supported by support 915. Lighting strips 900 of this embodiment can be of any length, with 1-, 2-, or 3-foot segments being preferred. The strips 900 are connected to a power source by wire leads 909, which exit the lighting strip at hole 920. A waterproofing substance 923 can fill the area around the LEDs 902. The wire leads 909 can comprise insulation or other waterproofing material to completely fill the hole 920 and thereby waterproof the strip 900. The lighting strips can be mounted to a surface by way of holes 921 in support 922, through which screws or any other attaching mechanism can be used. Substrate 901 can be secured to housing 915 by way of screws 914.

FIGS. 10A-10D show additional embodiments of rigid light strips according to the invention. The lighting strips 1000 can be interconnected by directly joining the lighting strips end to end. These lighting strips are ideal for placing lighting strips on a single planar surface, such as in an end-to-end configuration, or the lighting strips can be used to cover multiple planar surfaces or disposed parallel to one another when the lighting strips are joined together indirectly using flexible connectors. For example, flexible connectors as shown in FIG. 29B can be used to indirectly connect the lighting strips with one another in a lighting strip system. These lighting strips and connectors each comprise a female end and a male end. The female end of one lighting strip or connector is operably configured to mate with the male end of another lighting strip or connector and the male end is operably configured to mate with the female end of another lighting strip or connector. Here, the male and female ends are square shaped with four prongs or corresponding plug holes for receiving the prongs (electrical contacts). These prongs and plug holes mate with one another as well as the overall square configuration of the ends. In addition, a latch can be included on one or both ends to further secure the interconnection between lighting strips and/or between lighting strips and the connectors. Here, a male side of the latch is disposed at one end of the lighting strip, which is operably configured to mate with a female side of the latch disposed at an opposing end of another lighting strip or at one end of a connector. The latch can be easily opened and closed to provide for re-arranging of the lighting strips as needed. No latch is also possible. The male and female ends of the connectors are connected physically and provide for electrical interconnection of the ends by way of flexible wires. The flexible wires allow for the lighting strips to be oriented in any direction relative to another lighting strip such as in a side-by-side configuration. The lighting strips can also be disposed in any angular direction relative to one another from 0 to 360 degrees in the same plane or in different planes. In embodiments, the lighting strips can comprise male ends or female ends at both ends of the strip while the connectors comprise the corresponding female or male ends instead of the lighting strips and connectors comprising one of each of a male and female end.

Embodiments of rigid light strips such as those shown in FIGS. 7A-7C, 8A-8D, 9A-9E, and 10A-10D are energy efficient, lead free, and long lasting meaning fewer replacements. They have outstanding energy efficiency: compared to standard light strips, VaOpto LED Hard Strips Series reduce energy consumption by 70%-80%. They deliver at least 70% of initial light output after at least 50,000 hours. LEDs of light strips may come in various colors, including red, amber, yellow, green, blue, RGB, cool white, neutral white, and warm white. They preferably use high brightness 0.5 W SMD PLCC-6 LEDs as lighting source with 120° viewing angle, may use a convenient connector between two strips, and are RoHS compliant. They may have an input voltage of 12V or 24V DC, may be waterproof or non-waterproof, have an aluminum alloy shell, and come in lengths of 1 ft, 2 ft, 3 ft, 4 ft, 5 ft, or 6 ft.

Representative optical and electrical parameters for embodiments of LED hard strips according to the invention include those listed in Tables 5 and 6 below.

TABLE 5

Representative Optical Parameters at Ta = 77° F. of Single-Color LED Hard Strips Using High Brightness High Brightness 0.5 W SMD PLCC-6 LEDs as Lighting Source

| Color | LED Qty. [PCS] | Viewing Angle [°] | Wavelength or Color Temperature | Luminous flux [lm] |
|---|---|---|---|---|
| Cool white | 18 | 120 | 5000-10000 k | 270 |
|  | 36 | 120 |  | 540 |
|  | 54 | 120 |  | 810 |
| Neutral White | 18 | 120 | 3700-5000 k | 235 |
|  | 36 | 120 |  | 470 |
|  | 54 | 120 |  | 700 |
| Warm white | 18 | 120 | 2600-3700 k | 180 |
|  | 36 | 120 |  | 360 |
|  | 54 | 120 |  | 540 |
| Red | 18 | 120 | 625 nm | 160 |
|  | 36 | 120 |  | 325 |
|  | 54 | 120 |  | 485 |
| Yellow | 18 | 120 | 590 nm | 160 |
|  | 36 | 120 |  | 325 |
|  | 54 | 120 |  | 485 |
| Green | 18 | 120 | 515 nm | 235 |
|  | 36 | 120 |  | 470 |
|  | 54 | 120 |  | 700 |
| Blue | 18 | 120 | 470 nm | 50 |
|  | 36 | 120 |  | 105 |
|  | 54 | 120 |  | 160 |
| Red/Green/Blue | 18 | 120 | 625/525/470 | 160/235/50 |
| Red/Green/Blue | 36 | 120 | 625/525/470 | 325/470/105 |
| Red/Green/Blue | 54 | 120 | 625/525/470 | 485/700/160 |

TABLE 6

Representative Electrical Parameters of Single-Color LED Hard Strips Using High Brightness 0.5 W SMD PLCC-6 LEDs as Lighting Source

| Parameters | Symbol | Values | Unit |
|---|---|---|---|
| Operating Voltage | Vopr | 12 (+/−5%) | V |
| Power Dissipation Max. | PD | Red/Yellow 2.88 Green/Blue/ 4.32 Cool White/Neutral White/Warm White | W/ft |
| Operating Temperature | Topr | −30-+85 (−22-+185) | ° C. (° F.) |
| Storage Temperature | Tstg | −30-+85 (−22-+185) | ° C. (° F.) |

In accordance with embodiments of the present invention, provided are various connector assemblies for lighting strips and lighting strip systems with connector assemblies. More particularly, the present invention relates to modular lighting systems, which provide for mechanical (e.g., physical) and electrical interconnection of multiple lighting strip devices to form lighting systems.

One of the many potential advantages of the connectors of the present invention, only some of which are discussed herein, is that the connectors may be used with a variety of lighting strips that can be combined and conveniently interconnected with the strip lighting to form modular lighting systems. In some embodiments, the connectors may be used with rigid lighting strips, flexible lighting strips, water-resistant, waterproof, or non-waterproof, and any combination thereof.

In certain embodiments, the connectors may also be used with PCBs that can be combined and conveniently interconnected with at least one operably mounted LED to form modular lighting systems. One of the advantages of the connectors of the present invention may include a multitude of configurations wherein they may provide for easily removable, friction-fit, latchless, and electrical interconnection of two or more components. Another advantage includes that certain embodiments of the invention may include lighting systems comprising a latch-type securing mechanism, preferably releasable, capable of securing the connection between lighting strips and connectors when installed but also allowing for convenient disengagement of the components for repairs. This should reduce the cost of making and disassembling such lighting systems, especially when components can be reused or are not damaged by previous installation means.

In embodiments of lighting systems according to the invention, included is a modular lighting system comprising: 1) a plurality of modular lighting strips each comprising: a non-conductive substrate strip comprising an electrical circuit; a plurality of light sources operably connected to the electrical circuit; a plug integrally formed at an end of the substrate strip; and a socket integrally formed at an opposing end of the substrate strip; wherein the plug and socket provide for removable, friction-fit, and electrical interconnection of two or more circuits; 2) a connector assembly comprising: a non-conductive substrate with an electrical circuit; two or more plugs and/or sockets integrally-formed with the substrate and in operable communication with the electrical circuit, wherein the plugs and sockets provide for removable, friction-fit, and electrical interconnection of two or more circuits of lighting strips when connected therewith; and 3) means for operably connecting a modular lighting strip or the connector to an electrical power supply for providing power to the light sources. Such connectors can also be used as connectors and provided as components to a lighting system.

The socket, plug, and wire provide for an electrical pathway through the connector from one socket/plug to the other. The socket and plug can be joined by way of soldering the electrical circuits of the sock and plug to the wire. Opposing ends of the double connector are a socket and plug, but could equally be two plugs, or a plug and a socket. Insulation can be used to cover the wires between the connectors to render the unit waterproof or water resistant, or the plug and socket can be encased in a plastic or rubber (insulative) sleeve. Connectors of the invention may also be 3-way connectors comprising a socket and two plugs, or a plug and two sockets, or 3 sockets or 3 plugs, for joining three lighting strips, or 4-way connectors comprising a socket and 3 plugs, a plug and 3 sockets, or 2 plugs and 2 sockets, or 4 sockets or 4 plugs, for joining four lighting strips, 5-way connectors comprising 3 sockets and 2 plugs, 3 plugs and 2 sockets, 1 socket and 4 plugs, 4 sockets and 1 plug, or 5 sockets or 5 plugs, for joining 5 lighting strips, or 6-way connectors, 7-way connectors, or even 8-way connectors, comprising any configuration of sockets and plugs.

FIGS. 11A-C, 12A-C, and 13A-13B show embodiments of 2-way waterproof (indoor damp) connectors 1100, 1200, 1300 and their components such as a socket 1111, 1211, 1311 and/or plug 1110, 1210 joined together through parallel wires 1102, 1202, 1302. More particularly, the connectors can comprise a socket end and a plug end for connecting two lighting strips together. FIG. 11A provides for a single color connector with a plug end and a socket end. More particularly, plug end 1111 comprises a positive electrical contact-disposed as a prong for mating a correspondingly shaped and sized-port of a corresponding socket end of a lighting strip. This positive electrical contact is disposed in the center of an annular negative electrical contact. The positive and negative electrical contacts interact with corresponding positive and negative electrical contacts of the lighting strips to which the connectors are intended to be connected. At the opposing end of the connector 1100 is a socket for electrical and physical connection with a correspondingly shaped and sized plug of a lighting strip. Here, the socket comprises a row of four individual receivers for a four prong plug.

Referring further to the Figures, FIG. 11A shows an embodiment of a 2-way "double" connector 1100 for single color lighting systems that comprises a socket 1111 and plug 1110 joined together through parallel wires 1100. Here, opposing ends of the double connector 1100 are a socket 1111 and plug 1110, but could equally be two plugs 1110, or a plug 1110 and a socket 1111. In this embodiment, the plug 1110 on the left side of the connector is circular with a single prong 1114 in the center as shown in FIG. 11B, and the socket 1111 is rectangular with 4 aligned holes 1115 positioned to accept 4 prongs as shown in FIG. 11C.

Figure 12A:
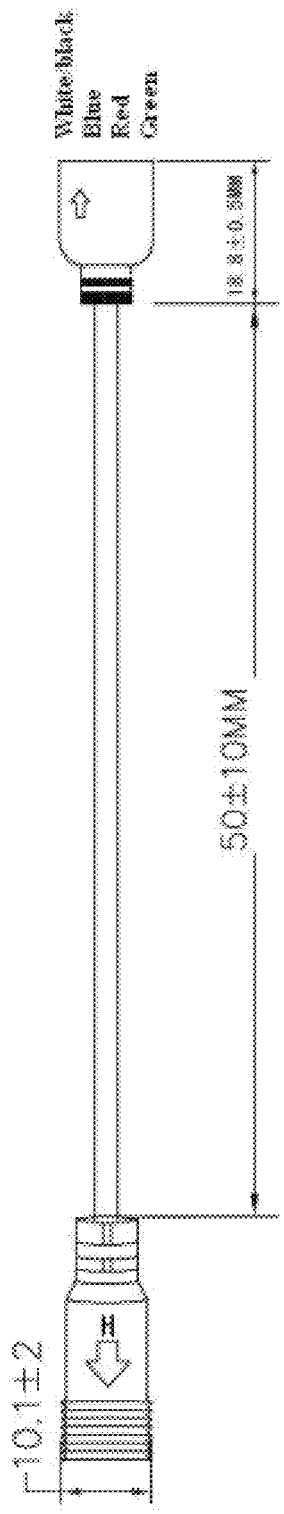
FIG. 12A is a schematic diagram showing an embodiment of a 2-way connector for waterproof (indoor damp) light strips.
Figure 12C:
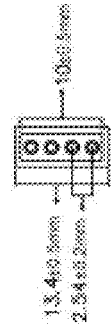
FIG. 12C is a schematic diagram showing a cross section of a socket component of the 2-way connector embodiment of FIG. 12A.
Figure 12B:
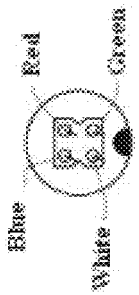
FIG. 12B is a schematic diagram showing a cross section of a socket component of the 2-way connector embodiment of FIG. 12A.

FIG. 12A shows another embodiment of a 2-way "double" connector 1200 for single color lighting systems of the invention, wherein two sockets 1211A and 1211B are joined together at the end of parallel wires 1202 to provide for an electrical pathway through the connector from the plug/socket to each other. Here, one socket 1211A of the double connector is circular and comprises 4 holes 1215A arranged in a square-type configuration in the middle of the socket 1211A as shown in FIG. 12B, and threads 1217 on the outside of the socket. The other socket 1211B has a square configuration with four aligned holes 1211B as shown in FIG. 12C. The electrical connections of this type of connector can also be protected from the elements with any number of available waterproofing or water-resistance means. FIG. 12A provides for a connector 1200 for multi color lighting strips with one socket end the same type as the second socket end of the connector shown in FIG. 11A and at the opposing end a square type socket comprising four ports for connecting multi color lighting strips with for example blue, red, white, and green LEDs.

Figure 13A:
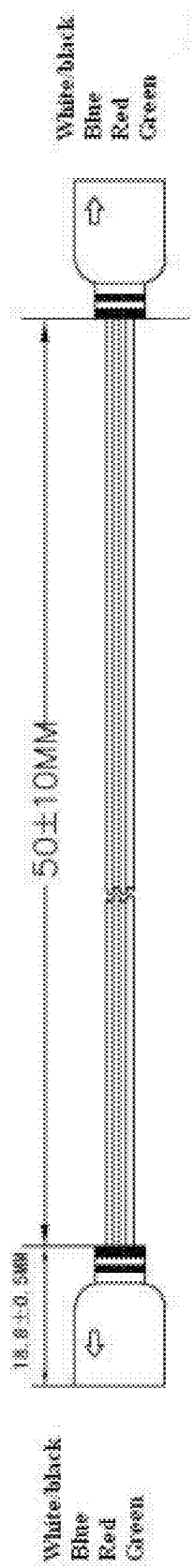
FIG. 13A is a schematic diagram showing an embodiment of a 2-way connector for waterproof (indoor damp) light strips.
Figure 13B:
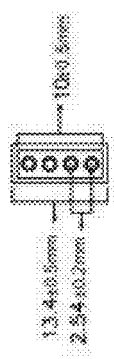
FIG. 13B is a schematic diagram showing a cross-section of a socket component of the 2-way connector embodiment of FIG. 13A.

FIG. 13A shows another embodiment of a 2-way "double" connector 1300 for single color lighting systems of the invention, wherein two sockets 1300 are joined together by four parallel wires 1302 to provide for an electrical pathway through the connector from socket 1311 to another 1311. In the embodiment, the sockets 1311 are the rectangular sockets with four aligned holes 1315 as shown in FIG. 13B. FIG. 13A is a connector with two ends and each end comprises the second socket end of FIGS. 11A and 12A which is a row of four individual sockets for interconnecting multi color lighting strips, such as lighting strips with white/black, blue, red, and green LEDs. Any combination of various types of plugs and sockets are possible for the connectors of the invention, for example, a connector comprising from 1, 2, 3, 4, 5, or 6 plugs or sockets, which can be the same or different are included as embodiments.

A connector with two ends can have both ends comprising the square type socket of FIG. 12C at both ends, or a square type socket of FIG. 12C at one end and a a plug of FIG. 11B at the other end. Likewise, a connector with both ends being the corresponding plugs that fit into such sockets described in FIGS. 11A-C, 12A-C, and 13A-13B can be used.

Figure 14A:
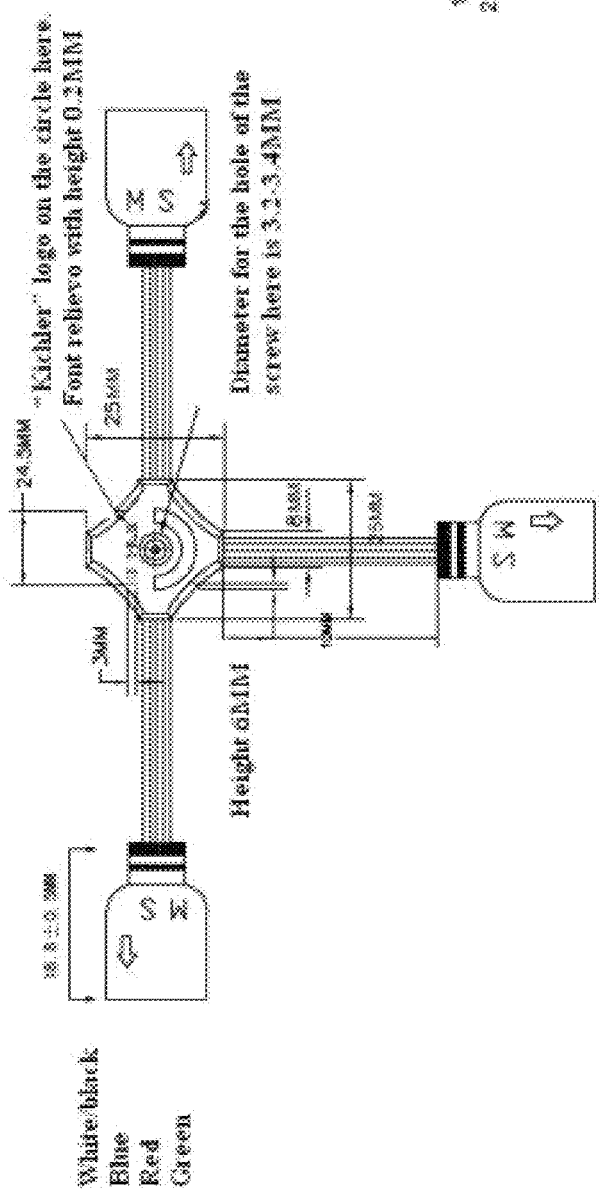
FIG. 14A is a schematic diagram showing an embodiment of a 3-way connector for waterproof (indoor damp) light strips.
Figure 14B:
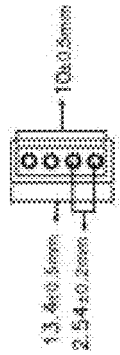
FIG. 14B is a schematic diagram showing a cross-section of a socket component of the 3-way connector embodiment of FIG. 14B.
Figure 16C:
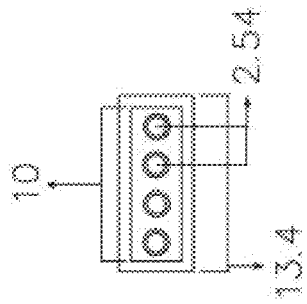
FIGS. 16A-16D are schematic diagrams showing embodiments of a socket and corresponding plug for light strips, including waterproof (indoor damp) light strips, non-waterproof light strips, and/or water-resistant light strips.
Figure 16B:
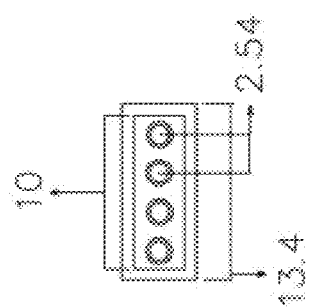
Figure 16A:
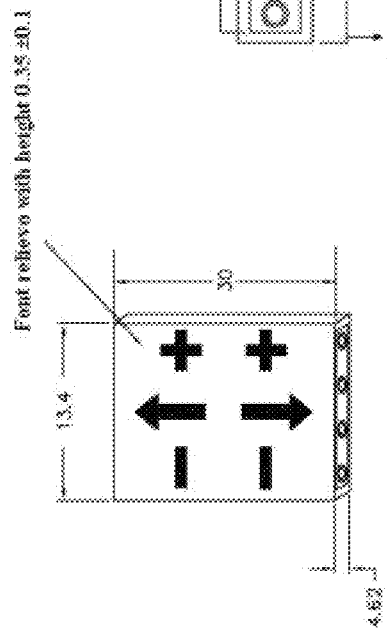
Figure 16D:
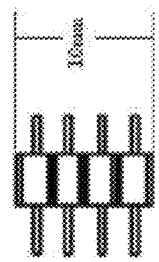

FIGS. 14A and 15A show embodiments of 3-way and 4-way connectors, respectively, for single color lighting systems of the invention, wherein three and four sockets 1411, 1511 are joined together to provide for an electrical pathway through the connector from one socket to the other. In these embodiments, the sockets 1411, 1511 are the rectangular socket with four aligned holes 1415, 1515 as shown in FIGS. 14B and 15B.

More particularly, FIG. 14A shows an embodiment of a 3-way waterproof (indoor damp) connector 1400 that comprises sockets 1411 joined together through wires 1402 arranged in a perpendicular configuration that are electrically connected with each other through an interface 1405. Such a connector can alternatively or in addition comprise plugs capable of interconnecting with the sockets. Although the wires are shown in a perpendicular position relative to one another, the wires connecting the sockets or plugs are flexible and can be flexed to provide the sockets or plugs in any position relative to one another. For example, one or more plugs/sockets can be positioned perpendicular relative the other plugs/sockets but instead of laying flat in the same plane, pointing upward out of the page or any position in between. The connectors shown can be used for multi color lighting strips, including a white/black, blue, red, green lighting strip. The socket shown in FIGS. 14B and 15B comprises a row of four individual ports for receiving corresponding prongs of complementary plugs.

FIG. 15A shows an embodiment of a 4-way waterproof (indoor damp) connector 1500 that comprises sockets 1511 joined together through wires 1502 arranged in a perpendicular configuration that are electrically connected with each other through an interface 1505.

Connectors and sockets of the invention such as the embodiments shown in FIGS. 11A-C, 12A-C, 13A-B, 14A-B, 15A-B, and 16A-D provide for a waterproof (indoor damp) connection of 2, 3, 4, or more waterproof lighting strips such as those shown in FIGS. 3A-3C and FIGS. 4A-4C.

FIGS. 16A-16D show embodiments of the rectangular socket 1611 with four aligned holes 1615 and show the configuration of the polarity of the socket, as well as a plug 1610. The 3- and 4-way connectors can alternatively comprise the corresponding plugs instead of the sockets as the ends, or combinations thereof. Indeed, any lighting strip or connector described in this specification can be configured to have male ends, female ends, or a combination thereof. Particular male or female ends described in one embodiment may be substituted for a particular male or female end described in any other embodiment.

FIGS. 17A-B, 18A-B, 19A-D, 20A-D, 21A-D, and 22A-D show embodiments of outdoor waterproof connectors according to the invention. More particularly, FIGS. 17A and 18A show embodiments of 2-way waterproof (outdoor wet) connectors 1700, 1800 that comprises a socket 1711, 1811 and/or plug 1710, 1810 joined together through parallel wires 1702, 1802. FIG. 17A shows an embodiment of a 2-way "double" outdoor waterproof connector 1700 for single color lighting systems of the invention. The outdoor waterproof connector can have a plug 1710 on one end of a wire 1702 and a socket 1711 with outside threads 1717 on the other end. The socket 1711, plug 1710, and wire 1702 provide for an electrical pathway through the connector from one socket 1711/plug 1710 to the other. In this embodiment, the plug 1710 comprises a single prong 1714 in the center of the plug 1710. Further shown in FIG. 17B is a threaded cap 1720 that is complementary for the threaded socket 1711 for maintaining a waterproof seal. As shown in FIG. 17A, the connector can comprise a post type plug at both ends, or a post type plug at one end and a socket at the other end that is shaped and sized to accept the post type plug, however, the ends of the connector would be joined to one or more lighting strips with similar shaped and sized connector ends.

In addition to 2-way connectors for waterproof connection of two lighting strips, the connectors can be configured as 3-way connectors for waterproof connection of three lighting strips, 4-way connectors for waterproof connection of four lighting strips, 5-way connectors for providing connection of five lighting strips, etc. In any of the system embodiments of the invention, one of the plugs/sockets of the connectors can be operably connected with a power source instead of a lighting strip.

FIG. 18A provides for a 2-ended connector with two ends comprising a square type connector for the plug/socket, which comprises four ports for accepting prongs of a corresponding plug/socket. This type of plug and socket each have a male characteristic and a female characteristic to ensure a secure connection between the corresponding plug and socket. For example, the male characteristic of the plug/socket shown is the square prong within which are disposed the four ports for accepting electrical contacts of a corresponding plug/socket. This square prong fits within a port on the other end of the connector shaped and sized to receive the square prong in a releasable, friction-fit type connection. Likewise, the ports are shaped and sized to receive prongs (electrical contacts) on the other end of the connector. Again, the lighting strips that communicate with these connectors each comprise one of the types of plugs/sockets at one end and the corresponding/complementary type of plug/socket at the other end. This type of connector is useful for connecting multi color lighting strips with transparent, blue, red, and green LEDs.

Further, FIG. 18A shows another embodiment of a 2-way "double" outdoor waterproof connector 1800 for single color lighting systems of the invention. In this embodiment, the plug 1810 comprises four prongs 1814 in a square configuration and the socket 1811 comprising outside threads 1817 and four holes 1815 in the center of the socket 1811 a square configuration. Further shown in FIG. 18B is a threaded cap 1820 that is complementary for the threaded socket 1811 for maintaining a waterproof seal between the complementary plug and socket.

Also shown in FIG. 17A and FIG. 17B is a cap which is disposed at one end of the connector and is internally threaded for communication with the externally threaded portion of the opposing end of the connector. These ends are provided on lighting strips intended to be joined with the connectors for use. The caps can provide a gasket for ensuring a waterproof connection between the end of the connector and the corresponding end of a lighting strip of a lighting strip system.

FIGS. 19A and 20A show embodiments of 3-way waterproof (outdoor wet) connectors 1900, 2000 that comprises a combination of sockets 1911, 2011 and/or plugs 1910, 2010 joined together through wires 1902, 2002 arranged in a Y-shaped configuration that are electrically connected with each other through an interface 1905, 2005. The interface in this embodiment or any connector embodiment of the invention can be a PCB with an electrical circuit where the wires leading from the sockets/plugs to the interface and operably connected to the electrical circuit of the interface. Alternatively or in addition the wire leads can be directly physically and electrically interconnected at the interface.

The plugs of FIG. 19A are of the single prong type comprising a positive electrical contact as a single prong disposed in the center of an annular negative electrical contact. The corresponding sockets of FIG. 19A are shaped and sized and operably configured for receiving the electrical contacts of the prong type plug. When used in a lighting system, lighting strips are provided with one or more ends comprising the same type of plug and/or socket for interconnection with the connectors. More particularly, FIG. 19A shows an embodiment of a 3-way, one socket, two plug connector with plugs and sockets of the same configuration as FIG. 17A, including threaded caps (shown in FIG. 19B) for providing a waterproof seal between the complementary plug and socket of the connector and lighting strip to which the connector can be operably connected. More particularly, FIG. 19A shows an embodiment of a 3-way, one plug, two socket outdoor waterproof connector 1900 with circular plugs 1910 that comprise a central prong 1914 and circular sockets 1911 comprising a central hole 1915 and outside threads 1917. Connector 1900 includes a threaded cap 1920 for providing a waterproof seal between the complementary plug and socket. The cap shown in FIG. 19B can comprise a rubber gasket for improving waterproof characteristics of the lighting system. FIGS. 19C and 19D show cross sections of the plugs and sockets.

FIG. 20A shows a similar Y-shaped connector with a square type plug and socket. Due to the flexibility of the wire leads, the sockets and plugs of the connectors of embodiments of the invention can be positioned in any position, for example, perpendicular, parallel, in the same plane, in a different plane, and at any angular position from any of the other plugs/sockets of the connector. This allows for lighting strips in a system comprising connectors to be joined together and disposed relative to other lighting strips in any position, including perpendicular, parallel, or from 0 to 360 degrees relative to another lighting strip in any direction in any plane. More particularly, FIG. 20A shows an embodiment of a 3-way, one plug, two socket outdoor waterproof connector 2000 with circular plugs 2010 that comprise four prongs 2014 arranged in a square configuration and circular sockets 2011 comprising threads 2017 and four holes 2015 in the center arranged in a square configuration. Connector 2000 includes a threaded cap 2020 for providing a waterproof seal between the complementary plug and socket. FIG. 20B shows a cross-section of the plug, FIG. 20C shows the interface component, and FIG. 20D shows a cross-section of the socket of the Y-shaped connector of FIG. 20A.

FIGS. 21A and 22B show embodiments of 4-way waterproof (outdoor wet) connectors 2100, 2200 that comprises a combination of sockets 2111, 2211 and/or plugs 2110, 2210 joined together through wires 2102, 2202 arranged in a 1 to 3 branching configuration that are electrically connected with each other through an interface 2105, 2205. For example, FIG. 21A shows an embodiment of a 4-way, one socket, three plug outdoor waterproof connector 2100 with plugs 2110 and sockets 2111 of the same configuration as FIG. 19A including plugs 2100 with central prongs 2114 and sockets 2111 with threads 2117 and central holes 2115 as well as a threaded cap 2120 (shown in FIG. 21B) for providing a waterproof seal between the complementary plug and socket. FIGS. 21C and 21D show cross sections of the plugs and sockets.

FIG. 22A shows an embodiment of a 4-way, one plug, three socket outdoor waterproof connector with plug 2210 and sockets 2211 with threads 2217 of the same configuration as FIG. 20A including prongs 2214 and holes 2215 arranged in a square configuration as well as a threaded cap 2220 for providing a waterproof seal between the complementary plug and socket. FIG. 22B shows a cross-section of the plug, FIG. 22C shows the interface component, and FIG. 22D shows a cross-section of the socket of the 4-way connector of FIG. 22A.

FIGS. 23A and 24A show embodiments of 2-way non-waterproof (indoor) connectors 2300, 2400 that comprises sockets 2311A and 2311B or 2411A and 2411B. Alternatively or in addition, the connectors can comprise the complementary plugs at one or both ends. As with other connector embodiments described in this specification, the plug and/or socket ends are joined together through parallel wires 2302, 2402. In FIG. 23B, provided is one plug end comprising a prong which is a positive post type electrical contact. The electrical circuit of a lighting strip is continued through the connector when joined therewith. At the other end is a slot type socket for receiving a PCB of a lighting strip as shown in FIG. 23C. FIG. 24A shows an embodiment with a square type socket at one end and a slot type socket at the other end.

FIG. 23A shows an embodiment of a 2-way "double" non-waterproof connector 2300 for single color lighting systems of the invention that comprises a socket 2311 and plug 2310 joined together through parallel wires 2302. The socket 2311, plug 2310, and wire 2302 provide for an electrical pathway through the connector from one socket/plug to the other. Here, opposing ends of the double connector 2300 are a socket 2311 and plug 2310, but could equally be two plugs 2310, or two sockets 2311. In this embodiment, the plug 2310 on the left side of the connector 2300 is circular with a single prong 2314 in the center, and the socket 2311 is provided with a slot 2315 for acceptance of the end of a non-waterproof lighting strip such as those shown in any of FIG. 1A-B, 2A-B, 3A-B, or 4A-B.

FIG. 24A shows an embodiment of a 2-way "double" non-waterproof connector 2400 for single color lighting systems of the invention. Here, the double connector comprises two sockets 2411A, 2411B wherein sockets 2411A comprises a slot 2415A and socket 2411B comprising 4 holes 2415B arranged in a square-type configuration in the middle of the socket 2411B, and threads 2417 on the outside of the socket 2411B for mating with a complementarily configured plug. The other socket 2411A end comprises a slot 2411A. FIGS. 24B and 24C show cross-sections of sockets 2411B and 2411A.

Figure 25A:
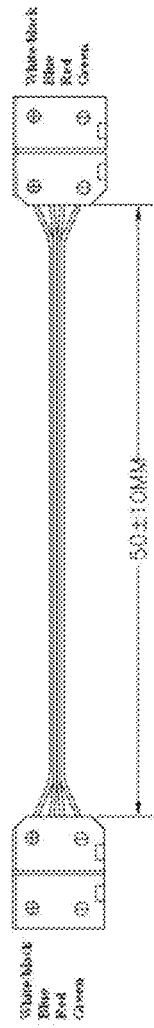
FIG. 25A is a schematic diagram showing an embodiment of a 2-way connector for non-waterproof (indoor dry) light strips.
Figure 25B:
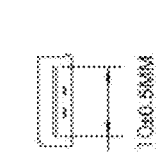
FIGS. 25B and 25C are schematic diagrams showing a cross-section of a socket component of the 2-way connector embodiment of FIG. 25A.
Figure 25C:
Figure 26A:
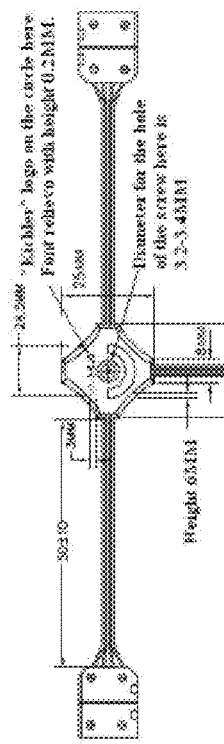
FIG. 26A is a schematic diagram showing an embodiment of a 3-way connector for non-waterproof (indoor dry) light strips.
Figure 26B:
FIG. 26B is a schematic diagram showing a cross-section of a socket component of the 3-way connector embodiment of FIG. 26A.

FIGS. 25A, 26A, and 27A show embodiments of 2-way, 3-way, and 4-way non-waterproof connectors for multi color lighting systems of the invention, each respectively with 2, 3, and 4 slot-type sockets 2511, 2611, 2711 with slots 2515, 2615, 2715 for accepting non-waterproof lighting strips of the invention. To connect lighting strips together using such connectors, a PCB based lighting strip comprising electrical contacts in operable communication with an electrical circuit on the PCB, can be inserted into the slot or socket portion of the connector (shown in FIGS. 25B, 25C, 26B, and 27B) wherein the electrical contacts of the PCB make physical and electrical interconnection with electrical contacts disposed within the socket of the connector. Additional configurations such as 5-way, 6-way, 7-way, or 8-way connectors employing the slot-type sockets are also within the scope of the invention.

Connectors of the invention such as the embodiments shown in FIGS. 23A-27B provide for a non-waterproof (indoor dry) connection of 2, 3, 4, or more non-waterproof (indoor dry) strips such as those shown in FIGS. 1A-1B and 2A-2B.

FIG. 26A shows an embodiment of a 3-way non-waterproof (indoor) connector 2600 that comprises a sockets 2611 joined together through wires 2602 arranged in a perpendicular configuration that are electrically connected with each other through an interface 2605. Similar, to other Y-shaped connectors, this connector is capable of being manipulated to provide the plugs/sockets in any position relative to the other plugs/sockets due to the flexible wire leads connecting the plugs/sockets. In this embodiment, the Y-shaped connector comprises three sockets with slot type receivers capable of receiving complementary shaped and sized PCB lighting strips.

FIG. 27A shows an embodiment of a 4-way non-waterproof (indoor) connector 2700 that comprises a sockets 2711 (FIG. 27B) joined together through wires 2702 arranged in a perpendicular configuration that are electrically connected with each other through an interface 2705.

Connectors of the invention such as the embodiments shown in FIGS. 17A-B, 18A-B, 19A-D, 20A-D, 21A-D, and 22A-D provide for a waterproof (outdoor wet) connection of 2, 3, 4, or more waterproof (outdoor wet) lighting strips such as those shown in FIGS. 5 and 6A-6C.

Figure 28:
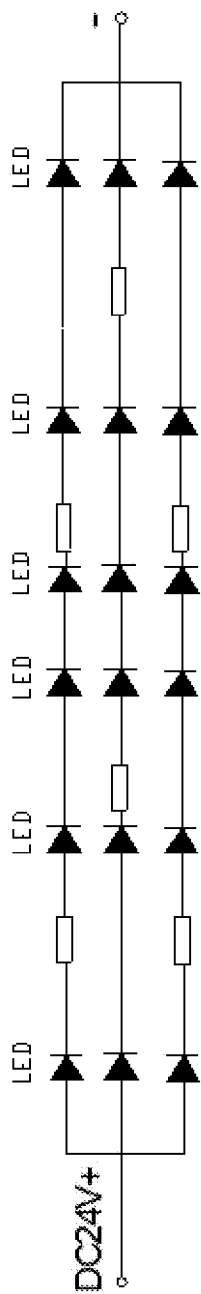
FIG. 28 is a schematic diagram showing an embodiment of an electrical circuit for providing power to the light sources of flexible and rigid light strips.

FIG. 28 shows an embodiment of a circuit diagram for flexible and rigid light strips according to the invention.

FIGS. 29A-C demonstrate various ways the lighting strips can be connected to a power source (FIG. 29A), or can be connected to one another using a connector (FIG. 29B), or can be directly connected with another lighting strip in and end-to-end configuration (FIG. 29C). Additionally, FIGS. 29D-F provide various clip configurations for installing rigid lighting strips to a surface. The clips provide for a releasable connection with a surface to allow for ease in mounting and dismounting the lighting strips on/off a surface.

FIGS. 30A-C provide various embodiments of accessories of the invention, including top switch power supply providing for 36 or 48 Watt power with a power output of 24 VDC and connectors with a 2.1 DC jack for single and full color lighting strips.

The lighting systems and strip lighting devices of the present invention are useful in many applications where strip-type lighting can be used. For example, the lighting devices and systems according to the invention can be used in any residential or commercial application where such lighting is desired for decoration, backlighting or functional lighting, including for aisle, path, and contour lighting, such as in theatres, hospitals, airplanes, concert halls, stadiums, and auditoriums; elegant interior decoration, such as in restaurants, nightclubs, casinos, piers, malls, streets, stations, stages, offices and lobbies; homes, including as accent lighting in living rooms, under cabinet lighting in kitchens, backlighting in display cases and shelving systems, functional and decorative lighting in entryways and recreational rooms; seasonal applications, such as for holiday decorations or landscape lighting; automobiles; architectural lighting, even including tent or canopy lighting; signal lighting; and backlighting larger size signs. The applications mentioned are merely representative of the numerous applications for which the lighting systems and strip lighting devices of the present invention may be applicable.

The present invention has been described with reference to particular embodiments having various features. It will be apparent to those skilled in the art that various modifications and variations can be made in the practice of the present invention without departing from the scope or spirit of the invention. One skilled in the art will recognize that these features may be used singularly or in any combination based on the requirements and specifications of a given application or design. It is intended that the specification and examples be considered as exemplary in nature and that variations that do not depart from the essence of the invention are intended to be within the scope of the invention.

The invention claimed is:

1. A modular lighting strip system comprising:
   (a) two or more lighting strips each comprising:
      a non-conductive substrate strip with an electrical circuit;
      a plurality of LEDs operably connected to the electrical circuit;
      a plug or socket at each of opposing ends of the substrate strip;
      wherein the plug is formed by electrical contacts mounted to an end of the substrate strip and operably connected to the electrical circuit;
      wherein the socket is mounted to an opposing end of the substrate strip and comprises a plug hole with internal electrical contacts operably connected to the electrical circuit; and
      wherein the plug and plug hole are oriented lengthwise in relation to the substrate strip and have complementary shapes and provide for latchless interconnection of two or more substrates; and
   (b) one or more connectors operably configured for providing electrical and physical interconnection of the lighting strips, the connectors comprising:
      at least one plug and at least one socket;
      at least two plugs; or
      at least two sockets; and
      one or more flexible wires interconnecting the plugs or sockets of the connectors, which wires are operably configured to provide for side-by-side interconnection of two or more of the lighting strips.

2. The modular lighting strip system of claim 1, wherein the substrate strip comprising an electrical circuit is a flexible printed circuit board.

3. The modular lighting strip system of claim 1, which is not waterproof.

4. The modular lighting strip system of claim 1, wherein the plug and socket are mounted directly to the substrate strip.

5. The modular lighting strip of claim 1, wherein the plug and socket are mounted to the substrate strip with a wire lead.

6. The modular lighting strip system of claim 1, wherein at least one connector of the one or more connectors comprises three or more plugs or sockets, or combinations thereof.

7. The modular lighting strip system of claim 1, wherein at least one connector of the one or more connectors comprises four or more plugs or sockets, or combinations thereof.

8. The modular lighting strip system of claim 1, wherein the one or more flexible wires are arranged in a perpendicular configuration.

9. The modular lighting strip system of claim 1, wherein the one or more flexible wires are arranged in a Y-shaped configuration.

10. The modular lighting strip system of claim 1, wherein the two or more lighting strips are rigid and comprise a plug integrally formed at one end of the non-conductive substrate strip and a socket integrally formed at an opposing end of the non-conductive substrate strip.

11. The modular lighting strip system of claim 1, wherein the two or more lighting strips are rigid and comprise a plug at one end and a socket at an opposing end of the non-conductive substrate strip, wherein the plug and the socket are connected with the non-conductive substrate strip by wire leads.

12. The modular lighting strip system of claim 1 comprising a power source connector for operably connecting a lighting strip to a power source.

13. The modular lighting strip system of claim 1, which is waterproof.

14. The modular lighting strip system of claim 1, wherein the two or more lighting strips are flexible or rigid and comprise:
   a plurality of high brightness LEDs operably connected to the electrical circuit;
   a water-proof or water-resistant colloid layer disposed partially or completely over the non-conductive substrate strip, the electrical circuit, and the plurality of high brightness LEDs;
   and a plug at one end and a socket at an opposing end of the non-conductive substrate strip operably connected therewith and operably configured to provide for waterproof or water resistant electrical interconnection of two or more electrical circuits.

15. The modular lighting strip system of claim 14, wherein the colloid layer is a polyurethane resin.

16. The modular lighting strip system of claim 14, wherein the non-conductive substrate strip is rigid and the colloid layer provides a waterproof cover for the non-conductive substrate strip by being disposed in a manner to completely cover any exposed upper surface area of the non-conductive substrate strip, to completely cover any exposed electrical circuit, and to partially cover each of the plurality of high brightness LEDs up to and excluding an upper surface of each of the plurality of high brightness LEDs.

17. The modular lighting strip system of claim 14, wherein the non-conductive substrate strip is flexible and the colloid layer encapsulates an upper surface of the non-conductive substrate strip, any exposed electrical circuit, and each of the plurality of high brightness LEDs in their entireties.

18. A modular lighting strip system comprising:
   two or more lighting strips each comprising:
      a non-conductive substrate strip with an electrical circuit;
      a plurality of light sources operably connected to the electrical circuit;
      a plug or socket at each of opposing ends of the substrate strip;
   one or more connectors operably configured for providing electrical and physical interconnection of the lighting strips, the connectors comprising:
      at least one plug and at least one socket, or at least two sockets, wherein at least one of the sockets has a slot configured to fit a PCB lighting strip directly; and
      one or more flexible wires interconnecting the plugs or sockets of the connectors, which wires are operably configured to provide for side-by-side interconnection of two or more of the lighting strips.

19. The modular lighting strip system of claim 18, wherein each connector comprises two sockets at opposite ends each having a slot configured to fit a PCB lighting strip directly.

20. The modular lighting strip system of claim 18, wherein the slot comprises electrical contacts configured to make physical and electrical interconnection with electrical contacts disposed on the PCB.

* * * * *